(12) United States Patent
Won et al.

(10) Patent No.: US 10,755,765 B2
(45) Date of Patent: Aug. 25, 2020

(54) LAYOUT STRUCTURE OF A BIT LINE SENSE AMPLIFIER IN A SEMICONDUCTOR MEMORY DEVICE

(71) Applicant: SAMSUNG ELECTRONICS CO., LTD., Suwon-si, Gyeonggi-Do (KR)

(72) Inventors: Bok-Yeon Won, Namyangju-si (KR); Hyuck-Joon Kwon, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 73 days.

(21) Appl. No.: 16/116,079

(22) Filed: Aug. 29, 2018

(65) Prior Publication Data

US 2019/0189191 A1 Jun. 20, 2019

(30) Foreign Application Priority Data

Dec. 18, 2017 (KR) .................. 10-2017-0174167

(51) Int. Cl.
| | |
|---|---|
| G11C 11/34 | (2006.01) |
| G11C 11/4091 | (2006.01) |
| G11C 7/08 | (2006.01) |
| G11C 7/18 | (2006.01) |
| G11C 8/14 | (2006.01) |
| G11C 11/408 | (2006.01) |
| G11C 11/4097 | (2006.01) |
| G11C 5/02 | (2006.01) |
| G11C 7/02 | (2006.01) |
| G11C 11/4094 | (2006.01) |

(52) U.S. Cl.
CPC .......... *G11C 11/4091* (2013.01); *G11C 5/025* (2013.01); *G11C 7/02* (2013.01); *G11C 7/08* (2013.01); *G11C 7/18* (2013.01); *G11C 8/14* (2013.01); *G11C 11/4087* (2013.01); *G11C 11/4094* (2013.01); *G11C 11/4097* (2013.01)

(58) Field of Classification Search
CPC ............ G11C 11/4091; G11C 11/4087; G11C 11/4094; G11C 11/4097; G11C 5/025; G11C 7/02; G11C 7/08; G11C 7/18; G11C 8/14
See application file for complete search history.

(56) References Cited

U.S. PATENT DOCUMENTS

| 7,639,556 B2 | 12/2009 | Yang et al. |
| 7,684,271 B2 | 3/2010 | Won |

(Continued)

FOREIGN PATENT DOCUMENTS

| KR | 1020060072515 | 6/2006 |
| KR | 1020100046769 | 5/2010 |

*Primary Examiner* — Toan K Le
(74) *Attorney, Agent, or Firm* — F. Chau & Associates, LLC

(57) ABSTRACT

A layout structure of a bit line sense amplifier in a semiconductor memory device includes a first bit line sense amplifier which is connected to a first bit line and a first complementary bit line, and is controlled via a first control line and a second control line. The first control line is connected to a first node of the first bit line sense amplifier and the second control line is connected to a second node of the first bit line sense amplifier, and the first bit line sense amplifier includes at least one pair of transistors configured to share any one of a first active region corresponding to the first node and a second active region corresponding to the second node.

20 Claims, 16 Drawing Sheets

(56) References Cited

U.S. PATENT DOCUMENTS

| | | | |
|---|---|---|---|
| 8,477,526 B2 | 7/2013 | Rountree | |
| 8,891,324 B2 * | 11/2014 | Yi | G11C 7/062 |
| | | | 365/202 |
| 8,952,437 B2 | 2/2015 | Wang et al. | |
| 9,147,465 B2 | 9/2015 | Seo et al. | |
| 9,177,619 B2 | 11/2015 | Kajigaya | |
| 2008/0080282 A1 * | 4/2008 | Chang | G11C 7/065 |
| | | | 365/205 |
| 2008/0259668 A1 * | 10/2008 | Min | G11C 5/025 |
| | | | 365/51 |
| 2018/0182449 A1 * | 6/2018 | Kim | G11C 5/025 |

* cited by examiner

Precharging Operation

Offset Cancelling Operation

Charge Sharing Operation

Pre-Sensing Operation

LAYOUT STRUCTURE OF A BIT LINE SENSE AMPLIFIER IN A SEMICONDUCTOR MEMORY DEVICE

CROSS-REFERENCE TO RELATED APPLICATION

This application claims priority under 35 U.S.C. § 119 to Korean Patent Application No. 10-2017-0174167, filed on Dec. 18, 2017 in the Korean Intellectual Property Office, the disclosure of which is incorporated by reference herein in its entirety.

TECHNICAL FIELD

Exemplary embodiments of the inventive concept relate to a semiconductor memory device, and more particularly, to a layout structure of a bit line sense amplifier to reduce noise during sensing and amplifying operations and to increase a sensing margin.

DISCUSSION OF RELATED ART

As a type of semiconductor memory device, dynamic random-access memory (DRAM) operates by recording data through charges stored in a cell capacitor of a memory cell. Each of the memory cells are connected to a bit line and a complementary bit line. In DRAM, when a read operation or a refresh operation is performed, a bit line sense amplifier amplifies a voltage difference between the bit line and the complementary bit line. Due to limitations of manufacturing process technology, noise may be generated in a layout structure of a designed bit line sense amplifier during sensing and amplifying operations, and thus, a wider sensing margin is not secured, resulting in reduced performance of the semiconductor memory device.

SUMMARY

According to an exemplary embodiment of the inventive concept, a layout structure of a bit line sense amplifier in a semiconductor memory device includes a first bit line sense amplifier which is connected to a first bit line and a first complementary bit line, and is controlled via a first control line and a second control line. The first control line is connected to a first node of the first bit line sense amplifier and the second control line is connected to a second node of the first bit line sense amplifier, and the first bit line sense amplifier includes at least one pair of transistors sharing any one of a first active region corresponding to the first node and a second active region corresponding to the second node.

According to an exemplary embodiment of the inventive concept, a layout structure of a bit line sense amplifier in a semiconductor memory device includes the bit line sense amplifier which is connected to a bit line and a complementary bit line, and is controlled via a first control line and a second control line. The bit line sense amplifier includes a first transistor and a second transistor configured to share a first active region corresponding to a first node connected to the first control line.

According to an exemplary embodiment of the inventive concept, a layout structure of a bit line sense amplifier, configured to perform a sensing operation and an amplifying operation for a memory operation of memory cells connected between a plurality of word lines and a plurality of bit lines, includes a first bit line sense amplifier which is connected to a first bit line and a first complementary bit line, controlled via a first control line and a second control line, and includes a first transistor, a second transistor, and a first active region corresponding to a first node connected to the first control line. The first transistor connected to the first complementary bit line via a gate shares the first active region with the second transistor connected to the first bit line via a gate, and the second transistor is arranged adjacent to the first transistor in a direction of the plurality of word lines.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
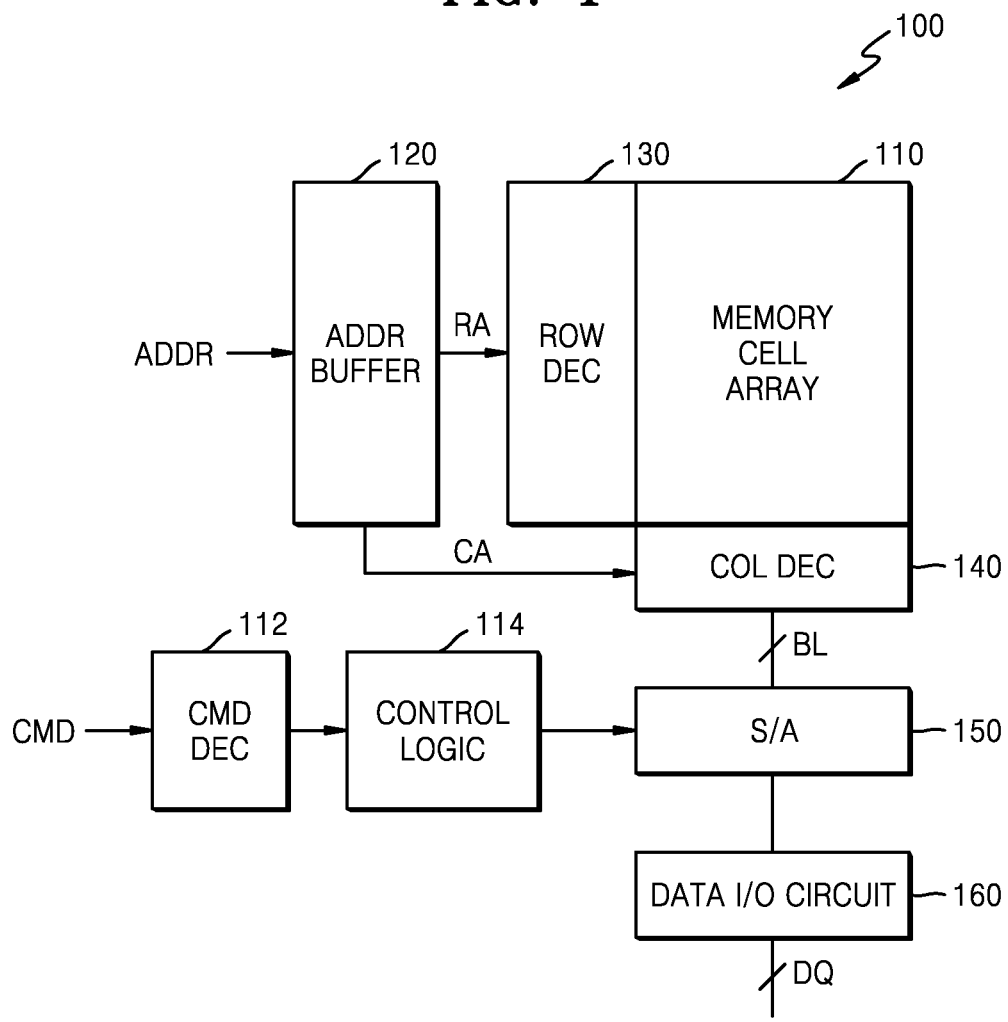
FIG. 1 is a block diagram illustrating a semiconductor memory device according to an exemplary embodiment of the inventive concept.

Exemplary embodiments of the inventive concept provide a layout structure of a bit line sense amplifier which increases a sensing margin by arranging transistors of the bit line sense amplifier to eliminate causes of noise generated during sensing and amplifying operations of the bit line sense amplifier.

Hereinafter, exemplary embodiments of the inventive concept will be described in detail with reference to the accompanying drawings. Like reference numerals may refer to like elements throughout this application.

FIG. 1 is a block diagram illustrating a semiconductor memory device according to an exemplary embodiment of the inventive concept.

Referring to FIG. 1, a semiconductor memory device 100 may be a storage device including semiconductor elements. For example, the semiconductor memory device 100 may be dynamic random-access memory (RAM) (DRAM), such as synchronous DRAM (SDRAM), double data rate (DDR) SDRAM (DDR SDRAM), low power double data rate SDRAM (PLDDR SDRAM), graphics DDR (GDDR), synchronous DRAM (SDRAM), DDR3 SDRAM, or DDR4 SDRAM, or a resistive memory, such as phase change RAM (PCRAM), magnetic RAM (MRAM), or resistive RAM (RRAM).

The semiconductor memory device 100 may output data via data lines DQ in response to a command CMD, an address ADDR, and control signals that are received from an external device, for example, a memory controller. The semiconductor memory device 100 may include a memory cell array 110, an address buffer 120, a row decoder 130, a column decoder 140, a command decoder 112, a control logic 114, a bit line sense amplifier module (S/A) 150, and a data input/output circuit 160.

The memory cell array 110 may include a plurality of memory cells provided in a matrix form arranged in rows and columns. The memory cell array 110 may include a plurality of word lines and a plurality of bit lines BL connected to the memory cells. The plurality of word lines may be connected to the rows of the memory cells and the plurality of bit lines BL may be connected to the columns of the memory cells.

The command decoder 112 may decode a write enable signal /WE, a row address strobe signal /RAS, a column address strobe signal /CAS, a chip select signal /CS, or the like, which are received from the external device, for example, the memory controller, so that control signals corresponding to the command CMD are generated by the control logic 114. The command CMD may include an active command, a read command, a write command, a precharge command, or the like.

The address buffer 120 may receive the address ADDR from the external device, for example, the memory controller. The address ADDR may include a row address RA to address the row of the memory cell array 110 and a column address CA to address the column of the memory cell array 110. The address buffer 120 may send the row address RA to the row decoder 130 and the column address CA to the column decoder 140.

The row decoder 130 may select any one of the plurality of word lines connected to the memory cell array 110. The row decoder 130 may decode the row address RA received from the address buffer 120, select any one word line corresponding to the row address RA, and activate the selected word line.

The column decoder 140 may select a certain bit line BL among the plurality of bit lines BL of the memory cell array 110. The column decoder 140 may decode the column address CA received from the address buffer 120 and select the certain bit line BL corresponding to the column address CA.

The bit line sense amplifier module 150 may include a plurality of bit line sense amplifiers respectively connected to the bit lines BL of the memory cell array 110. The bit line sense amplifier may sense a voltage change of the bit line BL connected thereto, amplify the voltage change, and output the amplified voltage change. The data input/output circuit 160 may output to the outside, via the data lines DQ, data generated based on a voltage that is sensed and amplified by the bit line sense amplifier module 150.

Each of the bit line sense amplifiers may be connected to one bit line BL and one complementary bit line, and control sensing and amplifying operations via a first control line and a second control line. For example, the first control line may be connected to an internal power supply of the semiconductor memory device 100 to selectively supply an internal power supply voltage to a certain node of the bit line sense amplifier, and the second control line may be connected to a ground terminal of the semiconductor memory device 100 to ground a certain node of the bit line sense amplifier. The first control line may be connected to a first node of the bit line sense amplifier and the second control line may be connected to a second node of the bit line sense amplifier.

A layout structure of the bit line sense amplifier according to an exemplary embodiment of the inventive concept may be such that the bit line sense amplifier is arranged as described above and further includes at least a pair of transistors sharing any one of a first active region corresponding to the first node and a second active region corresponding to the second node. Various exemplary embodiments and detailed contents of the layout structure of the bit line sense amplifier will be described below.

Figure 2:
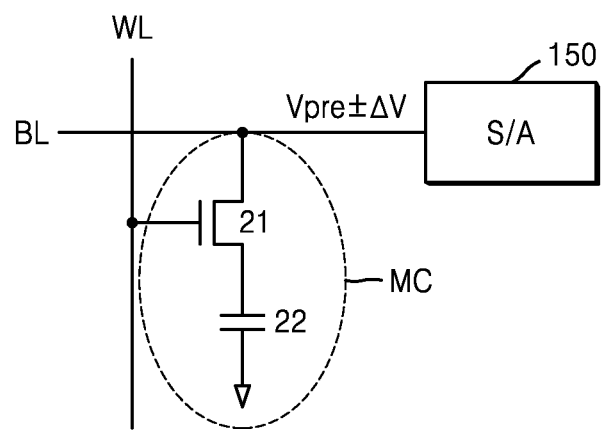
FIG. 2 is a diagram for explaining a bit line voltage sensing operation of a conventional bit line sense amplifier.

FIG. 2 is a diagram for explaining a bit line voltage sensing operation of a conventional bit line sense amplifier module.

Referring to FIGS. 1 and 2, a memory cell MC included in the memory cell array 110 may include a cell transistor 21 and a cell capacitor 22. The semiconductor memory device 100 may perform a read operation or a refresh operation based on an amount of charge of the cell capacitor 22 included in the memory cell MC. At this time, the bit line BL connected to the memory cell MC may be precharged to a precharge voltage Vpre. Thereafter, as a word line WL is activated, a charge sharing operation may occur between a charge of the bit line BL charged to the precharge voltage Vpre and the charge of the cell capacitor 22 of the memory cell MC. A voltage of the bit line BL may decrease or increase by a voltage change amount ΔV from the precharge voltage Vpre during the charge sharing operation.

The bit line sense amplifier module 150 or the bit line sense amplifier connected to the bit line BL may detect the voltage change amount ΔV and amplify the detected voltage change amount ΔV. At this time, a general effective sensing margin of the bit line sense amplifier module 150 may be reduced due to the noise that is generated during the sensing and amplifying operations because of the layout structure of a conventional bit line sense amplifier. When the voltage change amount ΔV is less than a certain level, the bit line sense amplifier module 150 may not detect the voltage change amount ΔV of the bit line BL. In other words, due to the layout structure of the conventional bit line sense amplifier applied to the bit line sense amplifier module 150, the effective sensing margin may be reduced, and as a result, performance of the semiconductor memory device 100 including the bit line sense amplifier module 150 may be deteriorated.

Figure 3:
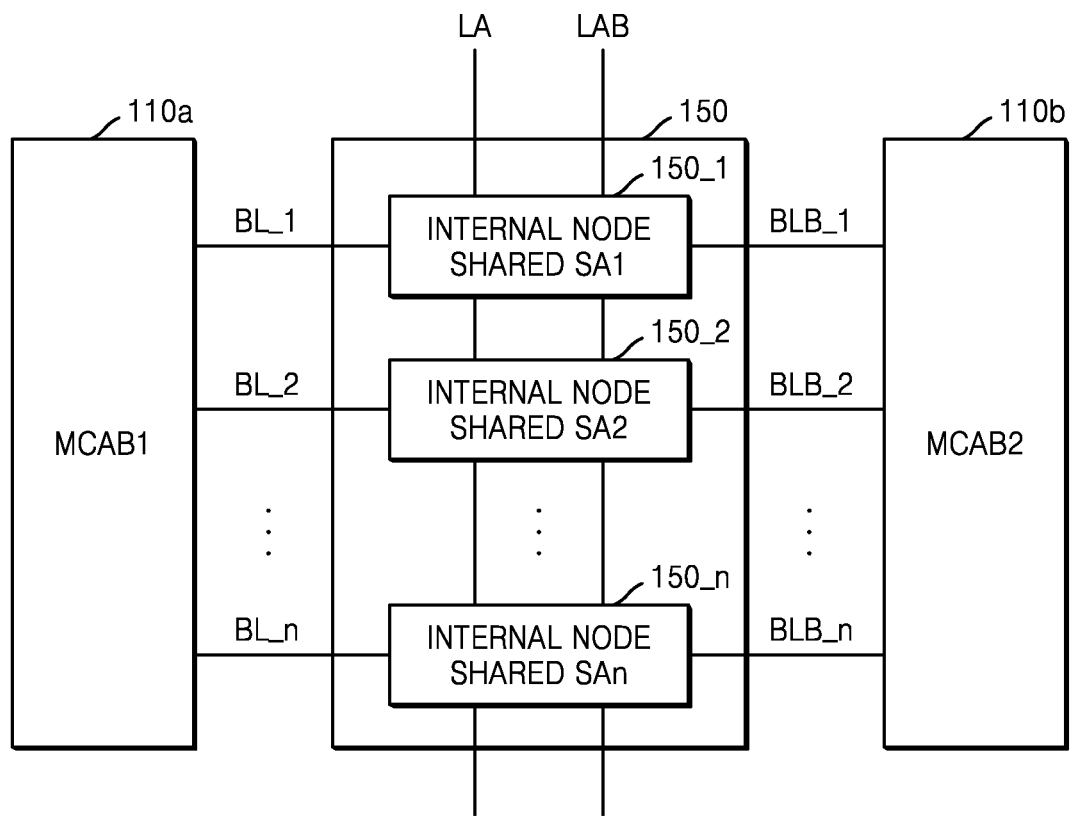
FIG. 3 is a block diagram illustrating a bit line sense amplifier in FIG. 1.
Figure 4:
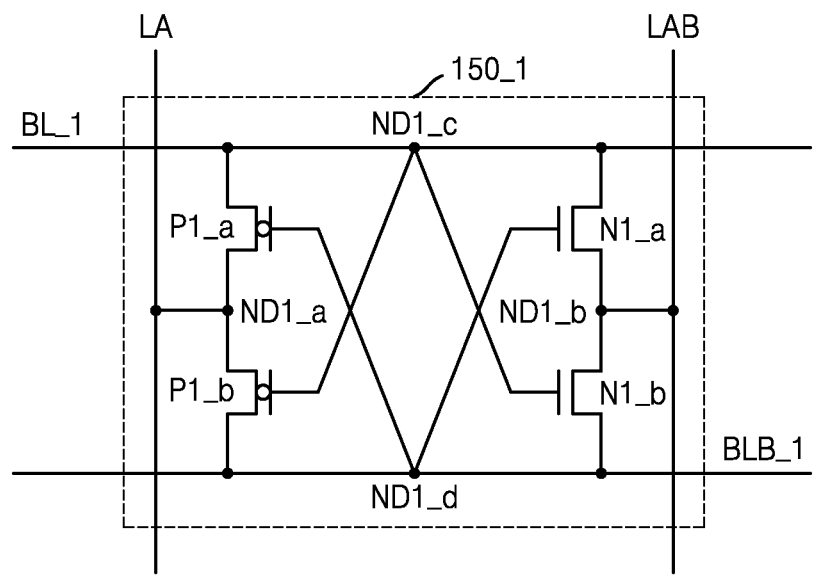
FIG. 4 is a circuit diagram illustrating a first bit line sense amplifier in FIG. 3, according to an exemplary embodiment of the inventive concept.

FIG. 3 is a block diagram illustrating a bit line sense amplifier module in FIG. 1, and FIG. 4 is a circuit diagram illustrating a first bit line sense amplifier in FIG. 3, according to an exemplary embodiment of the inventive concept.

Referring to FIG. 3, the bit line sense amplifier module 150 may be connected between a first memory cell array block (MCAB1) 110a and a second memory cell array block (MCAB2) 110b. The bit line sense amplifier module 150 may include first through $n^{th}$ bit line sense amplifiers 150_1 through 150_n (where n is an integer of 2 or more) respectively connected to first through $n^{th}$ bit lines BL_1 through BL_n and respectively connected to first through $n^{th}$ complementary bit lines BLB_1 through BLB_n. For example, the first bit line sense amplifier 150_1 may be connected to a first bit line BL_1 and a first complementary bit line BLB_1, and perform an operation of sensing and amplifying a voltage of the first bit line BL_1.

The first through $n^{th}$ bit line sense amplifiers 150_1 through 150_n may be connected to a first control line LA and a second control line LAB, and control the sensing and amplifying operations via the first control line LA and the second control line LAB. Hereinafter, a circuit configuration of the first bit line sense amplifier 150_1 will be described.

Referring to FIG. 4, the first bit line sense amplifier 150_1 may include a plurality of transistors P1_a, P1_b, N1_a, and N1_b. In an exemplary embodiment of the inventive concept, the transistors P1_a and P1_b may be p-channel transistors and the transistors N1_a and N1_b may be n-channel transistors. The transistor P1_a and the transistor P1_b may be referred to as a pair of p-channel transistors, and the transistors N1_a and N1_b may be referred to as a pair of n-channel transistors. Sources of the transistors P1_a and P1_b may be connected to the first control line LA via a first node ND1_a. Sources of the transistors N1_a and N1_b may be connected to the second control line LAB via a second node ND1_b. The first node ND1_a and the second node ND1_b may be referred to as a first source node and a second source node, respectively, of the first bit line sense amplifier 150_1. In addition, drains of the transistors P1_a and N1_a may be connected to the first bit line BL_1 via a first drain node ND1_c. The drains of the transistors P1_b and N1_b may be connected to the first complementary bit line BLB_1 via a second drain node ND1_d.

The first bit line sense amplifier 150_1 may sense the voltage change amount ΔV of the first bit line BL_1 and amplify the sensed voltage change amount. The first bit line sense amplifier 150_1 may be supplied with the internal power supply voltage of the semiconductor memory device 100 via the first control line LA to the first node ND1_a when performing the sensing and amplifying operations, and the second node ND1_b may be connected to the ground terminal via the second control line LAB. The circuit configuration of the first bit line sense amplifier 150_1 illustrated in FIG. 4 may be applied to the second through $n^{th}$ bit line sense amplifiers 150_2 through 150_n illustrated in FIG. 3. The bit line sense amplifier may be referred to as an internal node sharing bit line sense amplifier.

The first bit line sense amplifier 150_1 of FIG. 4 may include a pair of p-channel transistors and a pair of n-channel transistors, and may be implemented with a circuit configuration cross-coupled among the transistors, but the inventive concept is not limited thereto. For example, the first bit line sense amplifier 150_1 may be implemented with various circuit configurations, and the inventive concept may be applied to various circuit configurations.

In FIG. 4, an equivalent circuit diagram of the first bit line sense amplifier 150_1 is illustrated, and an actual circuit configuration of the first bit line sense amplifier 150_1 may be different from that of FIG. 4 depending on the layout structure of the bit line sense amplifier. Hereinafter, the layout structures and the actual circuit configuration of the first bit line sense amplifier 150_1 will be described.

Figure 5A:
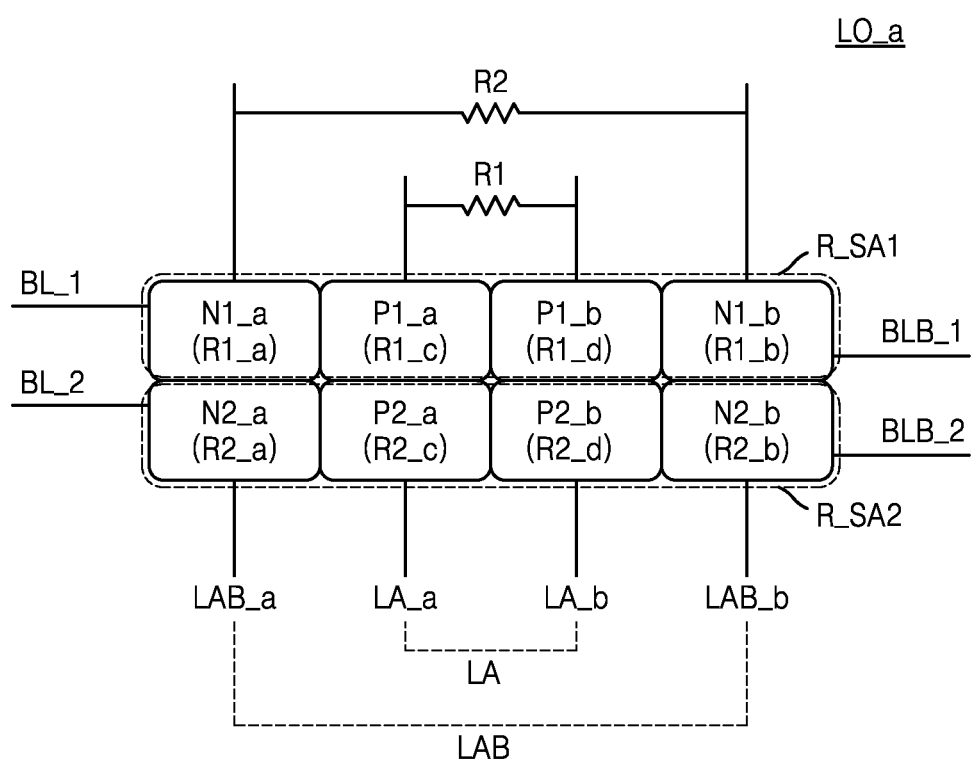
FIG. 5A is a diagram illustrating a layout structure of a bit line sense amplifier.
Figure 5B:
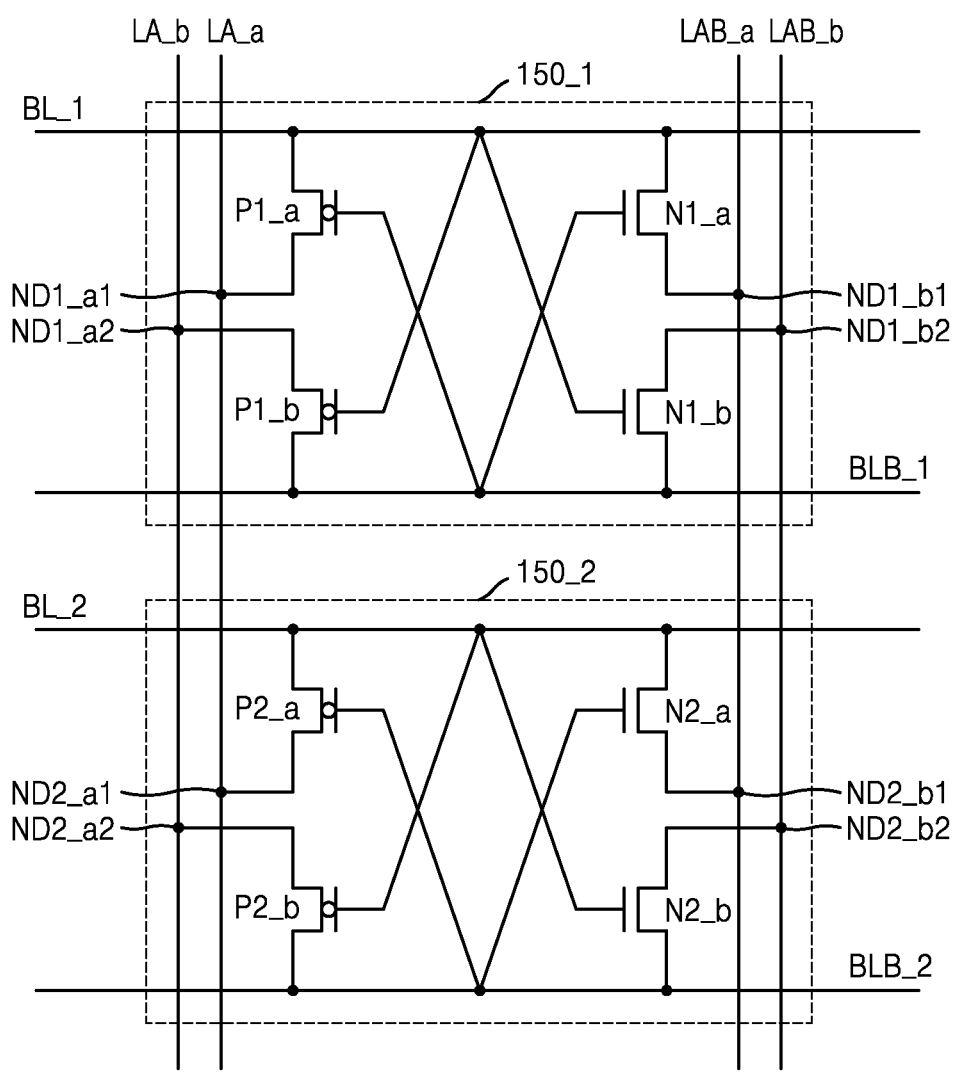
FIG. 5B is a circuit diagram illustrating a first bit line sense amplifier and a second bit line sense amplifier according to the layout structure of the bit line sense amplifier of FIG. 5A according to an exemplary embodiment of the inventive concept.

FIG. 5A is a diagram illustrating a layout structure of a bit line sense amplifier, and FIG. 5B is a circuit diagram illustrating first and second bit line sense amplifiers according to the layout structure of the bit line sense amplifier of FIG. 5A according to an exemplary embodiment of the inventive concept.

Referring to FIG. 5A, a layout structure LO_a of the bit line sense amplifier may include a first bit line sense amplifier region R_SA1 and a second bit line sense amplifier region R_SA2. The first bit line sense amplifier region R_SA1 may be a region in which the first bit line sense amplifier 150_1 is arranged and the second bit line sense amplifier region R_SA2 may be a region in which the second bit line sense amplifier 150_2 is arranged. The first bit line sense amplifier region R_SA1 may include a region R1_a in which the transistor N1_a is arranged, a region R1_b in which the transistor N1_b is arranged, a region R1_c in which the transistor P1_a is arranged, and a region R1_d in which the transistor P1_b is arranged. The second bit line sense amplifier region R_SA2 may include a region R2_a in which a transistor N2_a is arranged, a region R2_b in which a transistor N2_b is arranged, a region R2_c in which a transistor P2_a is arranged, and a region R2_d in which a transistor P2_b is arranged.

The transistors N1_a, P1_a, P1_b, and N1_b may be horizontally arranged with the first bit line BL_1 or the first complementary bit line BLB_1 in the first bit line sense amplifier region R_SA1. In addition, the transistors N2_a, P2_a, P2_b, and N2_b may be horizontally arranged with a second bit line BL_2 or a second complementary bit line BLB_2 in the second bit line sense amplifier region R_SA2.

In FIG. 4, the equivalent circuit diagram is illustrated in which sources of the transistors P1_a and P1_b are connected to the first control line LA via the first node ND1_a, and the sources of the transistors N1_a and N1_b are connected to the second control line LAB via the second node ND1_b. However, due to limitations in the layout structure LO_a of the bit line sense amplifier, it may be difficult to connect the sources of transistors P1_a and P1_b via the first control line LA, and to connect the sources of the transistors N1_a and N1_b via the second control line LAB.

Accordingly, in the layout structure LO_a of the bit line sense amplifier, after a control line LA_a and a control line LA_b that perform as the first control line LA are formed, the control line LA_a may be connected to the sources of the transistors P1_a and P2_a, and the control line LA_b may be connected to the sources of the transistors P1_b and P2_b. In addition, in the layout structure LO_a of the bit line sense amplifier, after a control line LAB_a and a control line LAB_b that perform as the second control line LAB are formed, the control line LAB_a may be connected to the sources of the transistors P1_a and P2_a, and the control line LAB_b may be connected to the sources of the transistors P1_b and P2_b.

Referring to FIG. 5B, the first bit line sense amplifier 150_1 may include the transistors P1_a, P1_b, N1_a, and N1_b. The source of the transistor P1_a may be connected to the control line LA_a via a node ND1_a1 (or a node ND2_a1), and the source of the transistor P1_b may be connected to the control line LA_b via a node ND1_a2 (or a node ND2_a2). The source of the transistor N1_a may be connected to the control line LAB_a via a node ND1_b1 (or a node ND2_b1), and the source of the transistor N1_b may be connected to the control line LAB_b via a node ND1_b2 (or a node ND2_b2).

In addition, the second bit line sense amplifier 150_2 may include the transistors P2_a, P2_b, N2_a, and N2_b. The source of the transistor P2_a may be connected to the control line LA_a via the node ND2_a1 (or the node ND1_a1), and the source of the transistor P2_b may be connected to the control line LA_b via the node ND2_a2 (or the node ND1_a2). The source of the transistor N2_a may be connected to the control line LAB_a via the node ND2_b1 (or the node ND1_b1), and the source of the transistor N2_b may be connected to the control line LAB_b via the node ND2_b2 (or the node ND1_b2).

In other words, in the actual circuit configuration, the sources of the transistors P1_a and P1_b and the sources of the transistors P2_a and P2_b may be connected to different control lines LA_a and LA_b, respectively, and the sources of the transistors N1_a and N1_b and the sources of the transistors N2_a and N2_b may be connected to different control lines LAB_a and LAB_b, respectively.

Referring again to FIG. 5A, certain distance differences may occur among the control lines LAB_a, LAB_b, LA_a, and LA_b that are connected to the transistors N1_a, N1_b, P1_a, and P1_b in the first bit line sense amplifier region R_SA1 and the transistors N2_a, N2_b, P2_a, and P2_b in the second bit line sense amplifier region R_SA2, respectively. The control line LA_a and the control line LA_b may be connected to the internal power supply of the semiconductor memory device to perform substantially the same function as the first control line LA. At this time, due to a resistance R1 between the control lines LA_a and LA_b or characteristic difference between the control lines LA_a and LA_b, noise may be generated during the sensing and amplification operations via the control lines LA_a and LA_b. In addition, the control line LAB_a and the control line LAB_b may be connected to the ground terminal of the semiconductor memory device so as to perform substantially the same role as the second control line LAB. At this time, due to a resistance R2 between the control lines LAB_a and LAB_b or characteristic difference between the control lines LAB_a and LAB_b, noise may be generated during the sensing and amplification operations via the control lines LAB_a and LAB_b.

As described above, the noise may occur during the sensing and amplifying operations due to the layout structure LO_a of the bit line sense amplifier, and such noise may cause a problem of reducing the sensing margin. Hereinafter, the layout structure of the bit line sense amplifier according to exemplary embodiments of the inventive concept to reduce such noise and increase the sensing margin will be described.

Figure 6:
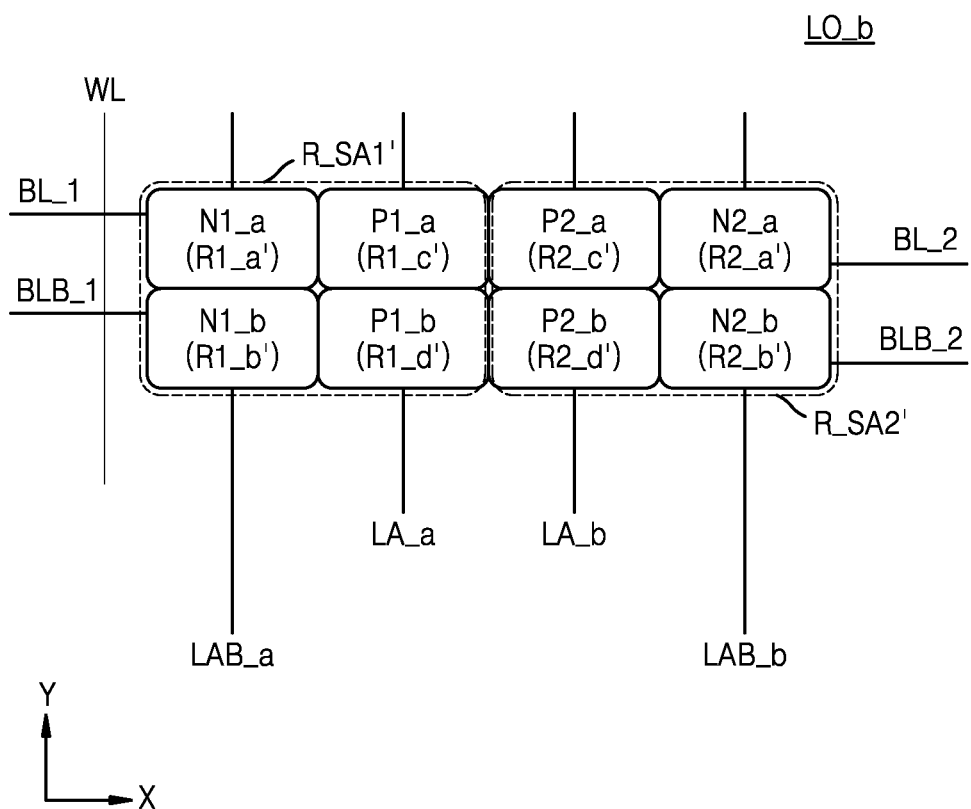
FIG. 6 is a diagram illustrating a layout structure of a bit line sense amplifier according to an exemplary embodiment of the inventive concept.

FIG. 6 is a diagram illustrating a layout structure of a bit line sense amplifier according to an exemplary embodiment of the inventive concept.

Referring to FIG. 6, a layout structure LO_b of the bit line sense amplifier may include a first bit line sense amplifier region R_SA1' and a second bit line sense amplifier region R_SA2'. Hereinafter, it is assumed that the first and second bit lines BL_1 and BL_2 and the first and second complementary bit lines BLB_1 and BLB_2 are formed in an X direction, and the word lines WL are formed in a Y direction perpendicular to the X direction. The first bit line sense amplifier region R_SA1' may include a region R1_a' in which the transistor N1_a is arranged, a region R1_b' in which the transistor N1_b is arranged, a region R1_c' in which the transistor P1_a is arranged, and a region R1_d' in which the transistor P1_b is arranged. The second bit line sense amplifier region R_SA2' may include a region R2_a' in which the transistor N2_a is arranged, a region R2_b' in which the transistor N2_b is arranged, a region R2_c' in which the transistor P2_a is arranged, and a region R2_d' in which the transistor P2_b is arranged.

An example of a transistor arrangement of the first bit line sense amplifier region R_SA1' according to an exemplary embodiment of the inventive concept may be that the transistor N1_a is arranged adjacent to the transistor N1_b in a word line direction (or the Y direction), and the transistor P1_a is arranged adjacent to the transistor P1_b in the word line direction (Y). The transistor P1_a may be arranged adjacent to the transistor N1_a in a bit line direction (X). Accordingly, in the layout structure LO_b of the bit line sense amplifier, the sources of the transistors P1_a and P1_b may be connected to the control line LA_a, and the sources of the transistors N1_a and N1_b may be connected to the control line LAB_a.

An example of a transistor arrangement of the second bit line sense amplifier region R_SA2' according to an exemplary embodiment of the inventive concept may be that the transistor N2_a is arranged adjacent to the transistor N2_b in the word line direction (Y), and the transistor P2_a is arranged adjacent to the transistor P2_b in the word line direction (Y). The transistor N2_a may be arranged adjacent to the transistor P2_a in the bit line direction (X). Accordingly, in the layout structure LO_b of the bit line sense amplifier, the sources of the transistors P2_a and P2_b may be connected to the control line LA_b, and the sources of the transistors N2_a and N2_b may be connected to the control line LAB_b.

In an exemplary embodiment of the inventive concept, the second bit line sense amplifier region R_SA2' in the layout structure LO_b of the bit line sense amplifier may be adjacent to the first bit line sense amplifier region R_SA1' in the bit line direction (X). In other words, the second bit line sense amplifier may be arranged adjacent to the first bit line sense amplifier in the bit line direction (X).

The layout structure LO_b of the bit line sense amplifier according to an exemplary embodiment of the inventive concept may reduce the noise that is generated by the control lines LA_a, LA_b, LAB_a, and LAB_b, thus increasing the sensing margin of the bit line sense amplifier.

Figure 7:
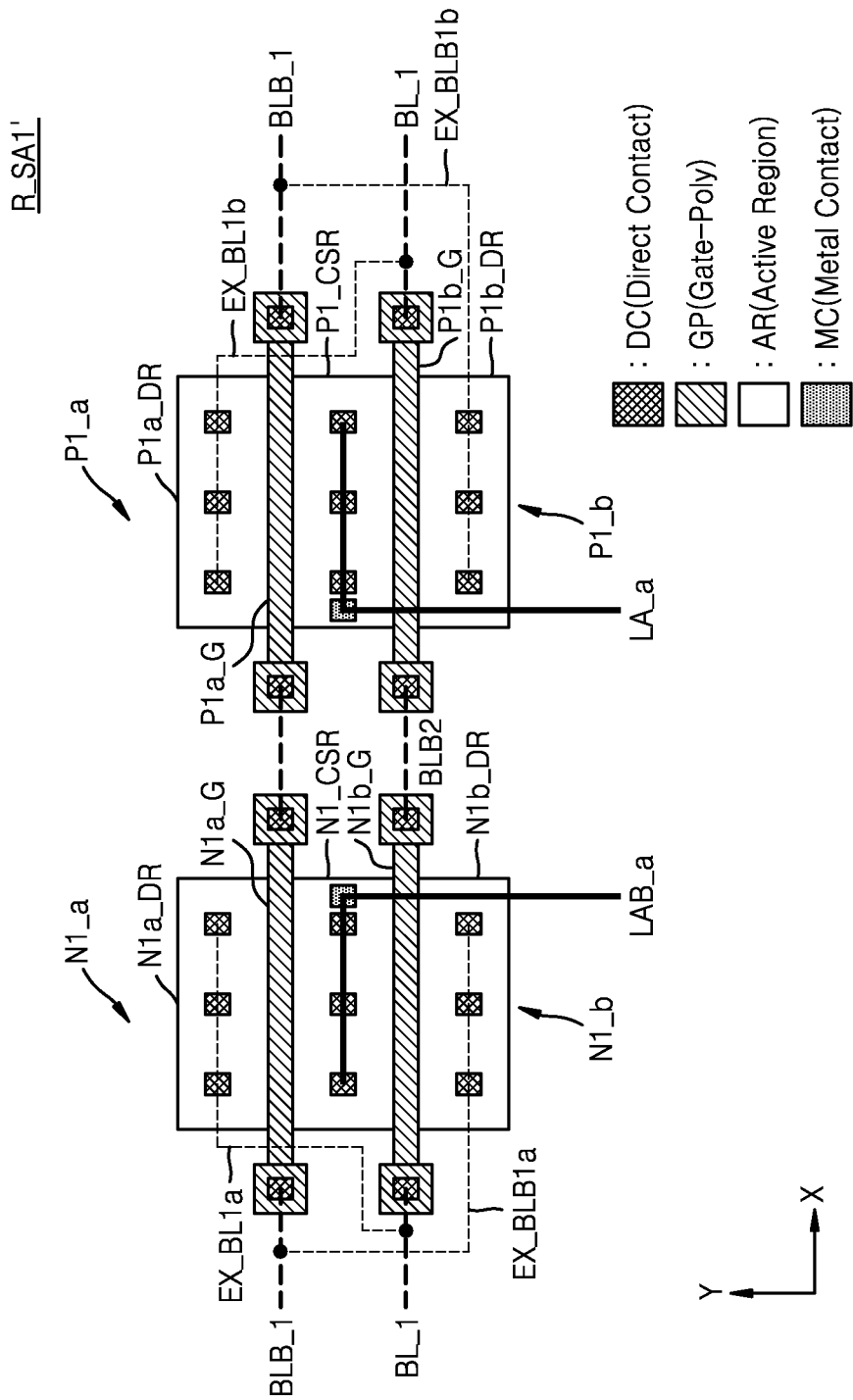
FIG. 7 is a diagram for explaining a layout structure of a first bit line sense amplifier region in FIG. 6 according to an exemplary embodiment of the inventive concept.

FIG. 7 is a diagram for explaining a layout structure of a first bit line sense amplifier region in FIG. 6 according to an exemplary embodiment of the inventive concept.

Referring to FIG. 7, the transistors N1_a, N1_b, P1_a, and P1_b may be arranged in the first bit line sense amplifier region R_SA1'. The transistor N1_a may include an active region AR having a certain size that includes a gate (or referred to as a gate line or a control terminal) N1a_G formed in the bit line direction (X), and conductive-type regions N1a-DR and N1_CSR in which the active region AR is divided by the gate N1a_G. For example, the gates of the transistors N1_a, N1_b, P1_a, and P1_b may be formed as a gate poly (GP). The transistor N1_a may include a channel formed in the Y direction perpendicular to the bit line direction (X). The conductive-type regions may refer to the regions where the sources or drains of the transistors are formed. For example, the drain of the transistor N1_a may be formed in the conductive-type region N1a_DR. The transistor N1_b sharing the conductive-type region N1_CSR with the transistor N1_a may be arranged adjacent to the transistor N1_a in the word line direction (Y). The transistor N1_b may have a structure similar to the transistor N1_a. In other words, the transistor N1_b may include the active region AR having a certain size that includes a gate N1b_G formed in the bit line direction (X), and conductive-type regions N1b_DR and N1_CSR in which the active region AR is divided by the gate N1b_G.

As described above, the transistors N1_a and N1_b may share a certain region of the active region AR such as the conductive-type region N1_CSR, and the conductive-type region N1_CSR may correspond to the second node ND1_b in FIG. 4. In addition, the source (or referred to as the first terminal) shared by the transistors N1_a and N1_b may be formed in the conductive-type region N1_CSR.

The first complementary bit line BLB1 may be connected to the gate N1a_G of the transistor N1_a via a direct contact DC, and a first extension line EX_BLB1a formed from the first complementary bit line BLB1 may be connected to the drain (or referred to as a second terminal) of the transistor N1_a formed in the conductive-type region N1b_DR via the direct contact DC. The first bit line BL1 may be connected to the gate N1b_G of the transistor N1_b via the direct contact DC, and a second extension line EX_BL1a formed from the first bit line BL1 may be connected to the drain of the transistor N1_a formed in the conductive-type region N1a_DR via the direct contact DC. The source shared by the transistor N1_a and the transistor N1_b may be connected to the control line LAB_a via the second node ND1_b in FIG. 4. The control line LAB_a may be a metal line and may be connected to the shared source of the conductive-type region N1_CSR via the direct contact DC and a metal contact MC.

The transistor P1_a may include the active region AR having a certain size that includes a gate P1a_G formed in the bit line direction (X), and conductive-type regions P1a_DR and P1_CSR in which the active region AR is divided by the gate P1a_G. The transistor P1_a may include a channel formed in the Y direction perpendicular to the bit line direction (X). For example, the drain of the transistor P1_a may be formed in the conductive-type region P1a_DR. The transistor P1_b sharing the conductive-type region P1_CSR with the transistor P1_a may be arranged adjacent to the transistor P1_a in the word line direction (Y) (there may be more). The transistor P1_b may have a structure similar to the transistor P1_a. In other words, the transistor P1_b may include the active region AR having a certain size that includes a gate P1b_G formed in the bit line direction (X), and conductive-type regions P1b_DR and P1_CSR in which the active region AR is divided by the gate P1b_G. As described above, the transistors P1_a and P1_b may share a certain region of the active region AR such as the conductive-type region P1_CSR, and the conductive-type region P1_CSR may correspond to the first node ND1_a in FIG. 4. In addition, the source shared by the transistor P1_a and the transistor P1_b may be formed in the conductive-type region P1_CSR.

The first complementary bit line BLB1 may be connected to the gate P1a_G of the transistor P1_a via the direct contact DC, and a third extension line EX_BLB1b formed from the first complementary bit line BLB1 may be connected to the drain of the transistor P1_b formed in the conductive-type region P1b_DR via the direct contact DC. The first bit line BL1 may be connected to the gate P1b_G of the transistor P1_b via the direct contact DC, and a fourth extension line EX_BL1b formed from the first bit line BL1 may be connected to the drain of the transistor P1_a formed in the conductive-type region P1a_DR via the direct contact DC. The source shared by the transistor P1_a and the transistor P1_b may be connected to the control line LA_a via the first node ND1_a in FIG. 4. The control line LA_a may be a metal line and may be connected to the shared source of the conductive-type region P1_CSR via the direct contact DC and the metal contact MC.

The layout structure of the first bit line sense amplifier region R_SA1' illustrated in FIG. 7 is only an example, and the inventive concept is not limited thereto. Various layout structures may be implemented by applying the inventive concept in which each of pairs of transistors (for example, a pair of n-channel transistors N1_a and N1_b and a pair of p-channel transistors P1_a and P1_b) shares certain conductive-type regions (for example, N1_CSR and P1_CSR), respectively, and the sources formed in the shared certain conductive-type regions (for example, N1_CSR and P1_CSR) are connected to control lines (for example, LAB_a and LA_a), respectively. In addition, the first through fourth extension lines EX_BL1a, EX_BL1b, EX_BLB1a, and EX_BLB1b are illustrated to include certain bending in FIG. 7, but the inventive concept is not limited thereto, and may be variously formed to be connected to respective drains of the transistors.

Figure 8A:
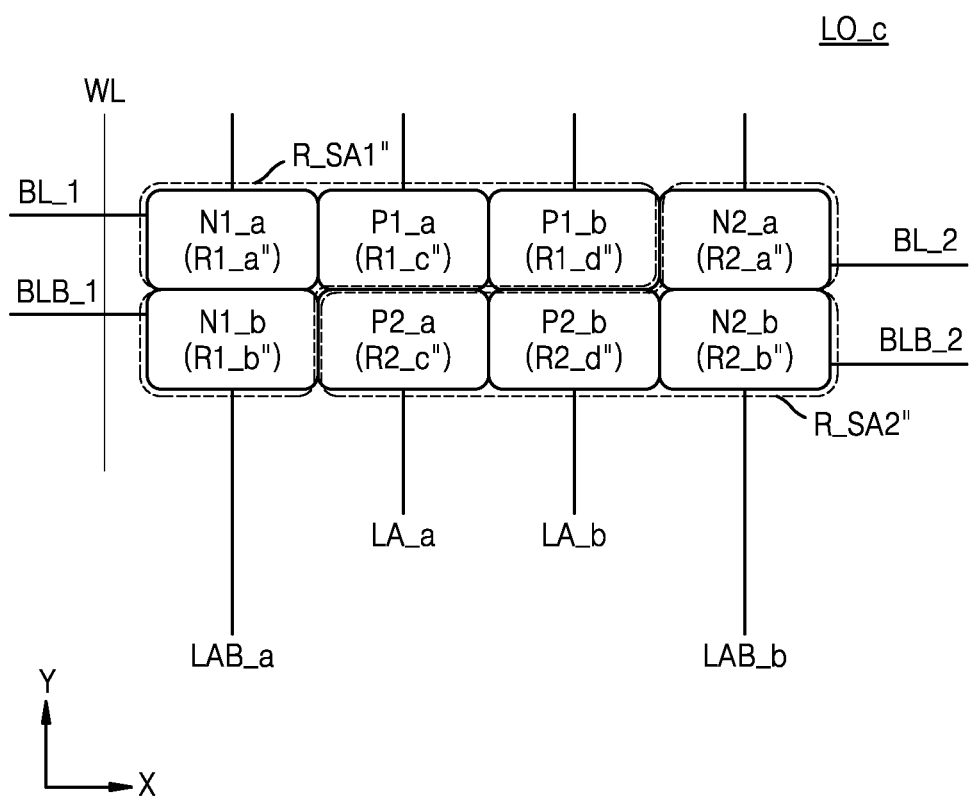
FIG. 8A is a diagram illustrating a layout structure of a bit line sense amplifier according to an exemplary embodiment of the inventive concept.
Figure 8B:
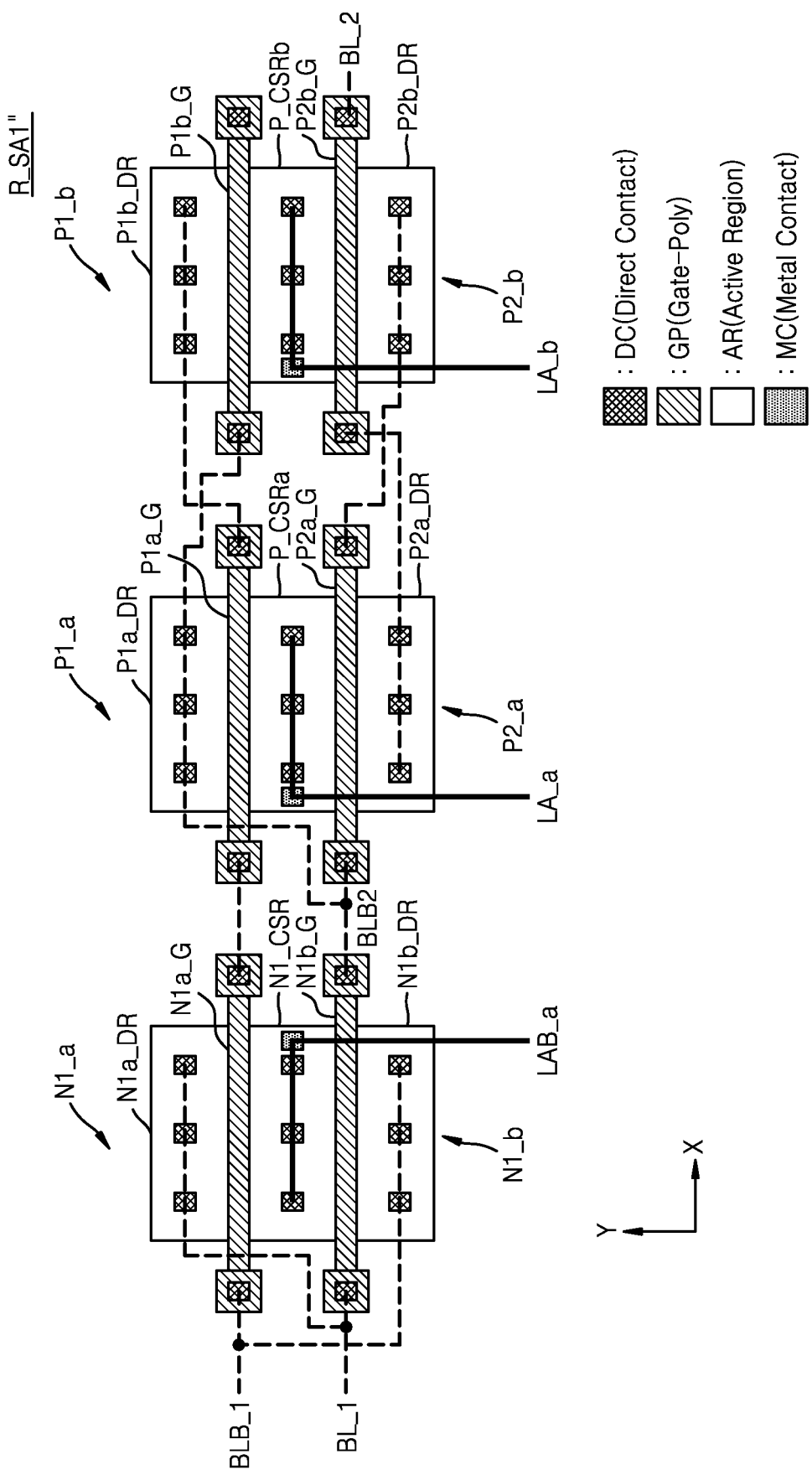
FIG. 8B is a diagram for explaining a layout structure of a first bit line sense amplifying region in FIG. 8A, according to an exemplary embodiment of the inventive concept.
Figure 8C:
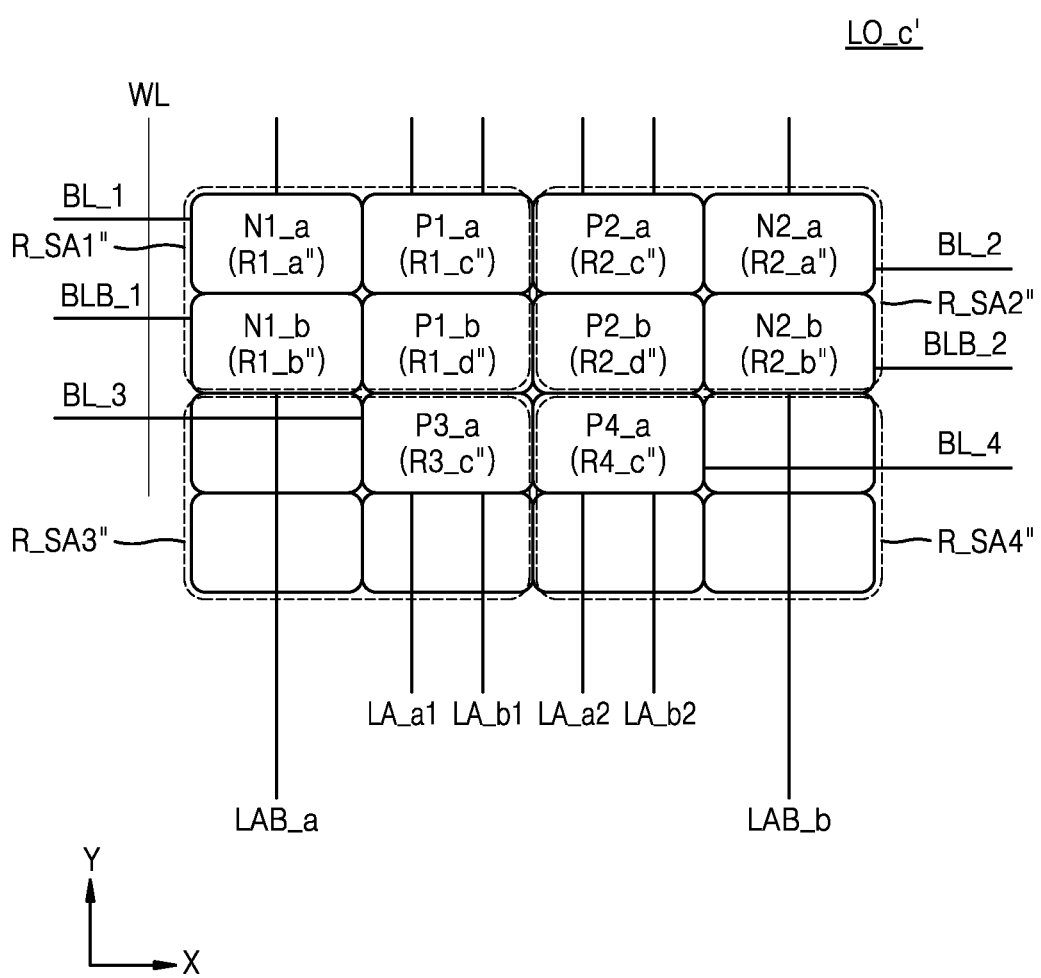
FIG. 8C is a diagram illustrating a layout structure of a bit line sense amplifier according to an exemplary embodiment of the inventive concept.

FIG. 8A is a diagram illustrating a layout structure of a bit line sense amplifier according to an exemplary embodiment of the inventive concept, and FIG. 8B is a diagram for explaining a layout structure for a first bit line sense amplifier region in FIG. 8A, according to an exemplary embodiment of the inventive concept. FIG. 8C is a diagram illustrating a layout structure of a bit line sense amplifier according to an exemplary embodiment of the inventive concept.

In FIG. 8A, unlike the layout structure LO_b of the bit line sense amplifier illustrated in FIG. 6, a layout structure LO_c of the bit line sense amplifier may be implemented so that the pair of n-channel transistors N1_a and N1_b and the pair of n-channel transistors N2_a and N2_b share active regions corresponding to the second node ND1_b, respectively, so as to constitute a configuration in which only the pair of n-channel transistors N1_a and N1_b and the pair of n-channel transistors N2_a and N2_b among the pairs of transistors are connected to the control lines LAB_a and LAB_b, respectively.

Referring to FIG. 8A, the layout structure LO_c of the bit line sense amplifier may include a first bit line sense amplifier region R_SA1" and a second bit line sense amplifier region R_SA2". The first bit line sense amplifier region R_SA1" may include a region R1_a" in which the transistor N1_a is arranged, a region R1_b" in which the transistor N1_b is arranged, a region R1_c" in which the transistor P1_a is arranged, and a region R1_d" in which the transistor P1_b is arranged. The second bit line sense amplifier region R_SA2" may include a region R2_a" in which the transistor N2_a is arranged, a region R2_b" in which the transistor N2_b is arranged, a region R2_c" in which the transistor P2_a is arranged, and a region R2_d" in which the transistor P2_b is arranged.

An example of a transistor arrangement of the first bit line sense amplifier region R_SA1" according to an exemplary embodiment of the inventive concept may be that the transistor N1_a is arranged adjacent to the transistor N1_b in the word line direction (Y), and the transistor P1_b is arranged adjacent to the transistor P1_a in the bit line direction (X). The transistor P1_a may be arranged adjacent to the transistor N1_a in the bit line direction (X). Accordingly, in the layout structure LO_c of the bit line sense amplifier, the sources of the transistors N1_a and N1_b may be connected to the control line LAB_a, and the sources of the transistors P1_a and P1_b may be respectively connected to the control lines LA_a and LA_b that are different from each other. An example of the transistor arrangement of the second bit line sense amplifier region R_SA2" may be similar to that of the first bit line sense amplifier region R_SA1" and thus, a detailed description thereof will be omitted.

In the layout structure LO_c of the bit line sense amplifier, unlike that illustrated with reference to FIG. 6, the transistor P1_a and the transistor P2_a may share a source, and the transistor P1_b and the transistor P2_b may share a source. The transistors P1_a and P2_a may be connected to the control line LA_a via the shared source of the transistors P1_a and P2_a, and the transistors P1_b and P2_b may be connected to the control line LA_b via the shared source of the transistors P1_b and P2_b. Details thereon will be described below with reference to FIG. 8B.

Referring to FIG. 8B, the transistors N1_a, N1_b, P1_a, and P1_b may be arranged in the first bit line sense amplifier region R_SA1", and for convenience of description, the transistors P2_a and P2_b arranged in the second bit line sense amplifier region R_SA2" will be further illustrated. The arrangement of the transistors N1_a and N1_b is substantially the same as that of the transistors N1_a and N1_b described with reference to FIG. 6, and a detailed description thereof will be omitted.

The transistor P1_a may include the active region AR having a certain size that includes the gate P1a_G formed in the bit line direction (X), and conductive-type regions P1a_DR and P_CSRa in which the active region AR is divided by the gate P1a_G. The transistor P1_a may include a channel formed in the Y direction perpendicular to the bit line direction (X). For example, the drain of the transistor P1_a may be formed in the conductive-type region P1a_DR. The transistor P2_a sharing the conductive-type region P1_CSRa with the transistor P1_a may be arranged adjacent to the transistor P1_a in the word line direction (Y). The transistor P2_a may have a structure similar to the transistor P1_a. In other words, the transistor P2_a may include the active region AR having a certain size that includes a gate P2a_G formed in the bit line direction (X), and conductive-type regions P2a DR and P_CSRa in which the active region AR is divided by the gate P2a_G. As described above, the transistors P1_a and P2_a may share a certain region of the active region AR such as the conductive-type region P_CSRa. The control line LA_a may be connected to the shared sources of the transistors P1_a and P2_a formed in the conductive-type region P_CSRa via the direct contact DC and the metal contact MC.

An arrangement relationship between the transistor P1_b and the transistor P2_b may be similar to that between the transistor P1_a and the transistor P2_a. In other words, the transistors P1_b and P2_b may share a certain region of the active region AR such as a conductive-type region P_CSRb. The control line LA_b may be connected to the shared sources of the transistors P1_b and P2_b formed in the conductive-type region P_CSRb via the direct contact DC and the metal contact MC.

When a strong condition resistant to the noise generated at a time of applying the internal power supply voltage, such as the internal power supply being in a stable state in the semiconductor memory device, is secured, the layout structure R_SA1" of the bit line sense amplifier illustrated in FIG. 8B may be applied.

In FIG. 8C, while maintaining the layout structure LO_b of the bit line sense amplifier illustrated in FIG. 6, a layout structure LO_c' of the bit line sense amplifier may be implemented so that the pair of n-channel transistors N1_a and N1_b and the pair of n-channel transistors N2_a and N2_b share active regions corresponding to the second node ND1_b, respectively, so as to constitute a configuration in which only the pair of n-channel transistors N1_a and N1_b and the pair of n-channel transistors N2_a and N2_b among the pairs of transistors are connected to the control lines LAB_a and LAB_b, respectively.

Referring to FIG. 8C, the layout structure LO_c' of the bit line sense amplifier may include the first bit line sense amplifier region R_SA1", the second bit line sense amplifier region R_SA2", a third bit line sense amplifier region R_SA3", and a fourth bit line sense amplifier region R SA4". In an exemplary embodiment of the inventive concept, the second bit line sense amplifier region R_SA2" may be adjacent to the first bit line sense amplifier region R_SA1" in the bit line direction (X), the third bit line sense amplifier region R_SA3" may be adjacent to the first bit line sense amplifier region R_SA1" in the word line direction (Y), and the fourth bit line sense amplifier region R SA4" may be adjacent to the second bit line sense amplifier region R_SA2" in the word line direction (Y).

As described above, the pair of transistors N1_a and N1_b and the pair of transistors N2_a and N2_b may share the source formed in the shared active region, and the pair of transistors N1_a and N1_b and the pair of transistors N2_a and N2_b may be connected to the control lines LAB_a and LAB_b via the shared source, respectively. The transistor P1_b may share a certain active region with a transistor P3_a arranged in the third bit line sense amplifier and may share a source formed in the shared certain active region, and the transistors P1_b and P3_a may be connected to the control line LA_a1 via the shared source. In addition, the transistor P2_b may share a certain active region with a transistor P4_a arranged in the fourth bit line sense amplifier and may share a source formed in the shared certain active region, and the transistors P2_b and P4_a may be connected to the control line LA_a2 via the shared source. In addition, the transistor P1_a may be connected to the control line LA_b1 via the source of the transistor P1_a, and the transistor P2_a may be connected to the control line LA_b2 via the source of the transistor P2_a. For convenience of description, although transistors sharing respective sources of the transistors P1_a and P2_a are not illustrated, the sources of the transistors P1_a and P2_a may respectively share sources of certain transistors arranged adjacent thereto.

In summary, with reference to FIGS. 8A and 8C, a transistor that does not share a source with another transistor arranged in the first bit line sense amplifier region among the transistors arranged in the first bit line sense amplifier region may be arranged to share a source with a transistor arranged in the second bit line sense amplifier region or the third bit line sense amplifier region adjacent to the first bit line sense amplifier region.

Figure 9:
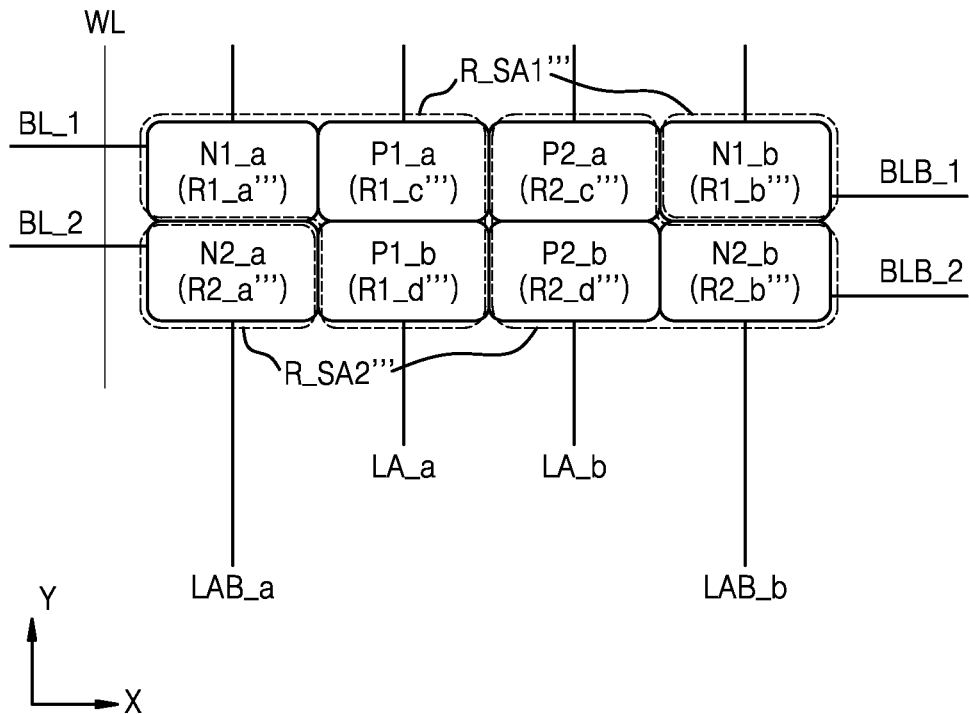
FIG. 9 is a diagram illustrating a layout structure of a bit line sense amplifier according to an exemplary embodiment of the inventive concept.

FIG. 9 is a diagram illustrating a layout structure of a bit line sense amplifier according to an exemplary embodiment of the inventive concept.

In FIG. 9, unlike the layout structure LO_b of the bit line sense amplifier illustrated in FIG. 6, a layout structure LO_d of the bit line sense amplifier may be implemented so that the pair of p-channel transistors P1_a and P1_b and the pair of p-channel transistors P2_a and P2_b share active regions corresponding to the first node ND1_a, so as to constitute a configuration in which only the pair of p-channel transistors P1_a and P1_b and the pair of p-channel transistors P2_a and P2_b among the pairs of transistors are connected to the control lines LA_a and LA_b, respectively.

Referring to FIG. 9, the layout structure LO_d of the bit line sense amplifier may include a first bit line sense amplifier region R_SA1''' and a second bit line sense amplifier region R_SA2'''. The first bit line sense amplifier region R_SA1''' may include a region R1_a''' in which the transistor N1_a is arranged, a region R1_b''' in which the transistor N1_b is arranged, a region R1_c''' in which the transistor P1_a is arranged, and a region R1_d''' in which the transistor P1_b is arranged. The second bit line sense amplifier region R_SA2''' may include a region R2_a''' in which the transistor N2_a is arranged, a region R2_b''' in which the transistor N2_b is arranged, a region R2_c''' in which the transistor P2_a is arranged, and a region R2_d''' in which the transistor P2_b is arranged.

An example of a transistor arrangement of the first bit line sense amplifier region R_SA1''' according to an exemplary embodiment of the inventive concept may be that the transistor P1_a is arranged adjacent to the transistor N1_a in the bit line direction (X), and the transistor P1_b is arranged adjacent to the transistor P1_a in the word line direction (Y). The transistor N1_b may be arranged apart from the transistor P1_a at regular intervals in the bit line direction (X). Accordingly, a shared source of the transistors P1_a and P1_b in the layout structure LO_d of the bit line sense amplifier may be connected to the control line LA_a. However, since the transistors N1_a and N1_b do not share a source, they may be connected to the control lines LAB_a and LAB_b, respectively, that are different from each other. An example of the transistor arrangement of the second bit line sense amplifier region R_SA2''' may be similar to that of the first bit line sense amplifier region R_SA1''' and thus, a detailed description thereof will be omitted.

However, the layout structure LO_d of the bit line sense amplifier illustrated in FIG. 9 is only an example, and the inventive concept is not limited thereto. While maintaining the layout structure LO_b of the bit line sense amplifier illustrated in FIG. 6, the layout structure LO_d of the bit line sense amplifier may be implemented so that the pair of p-channel transistors P1_a and P1_b and the pair of p-channel transistors P2_a and P2_b share active regions corresponding to the first node ND1_a, so as to constitute a configuration in which only the pair of p-channel transistors P1_a and P1_b and the pair of p-channel transistors P2_a and P2_b, among the pairs of transistors, are connected to the control lines LA_a and LA_b, respectively.

FIGS. 10A through 10D and 11 are diagrams for explaining operations of the bit line sense amplifier in FIG. 3 according to an exemplary embodiment of the inventive concept.

Figure 10A:
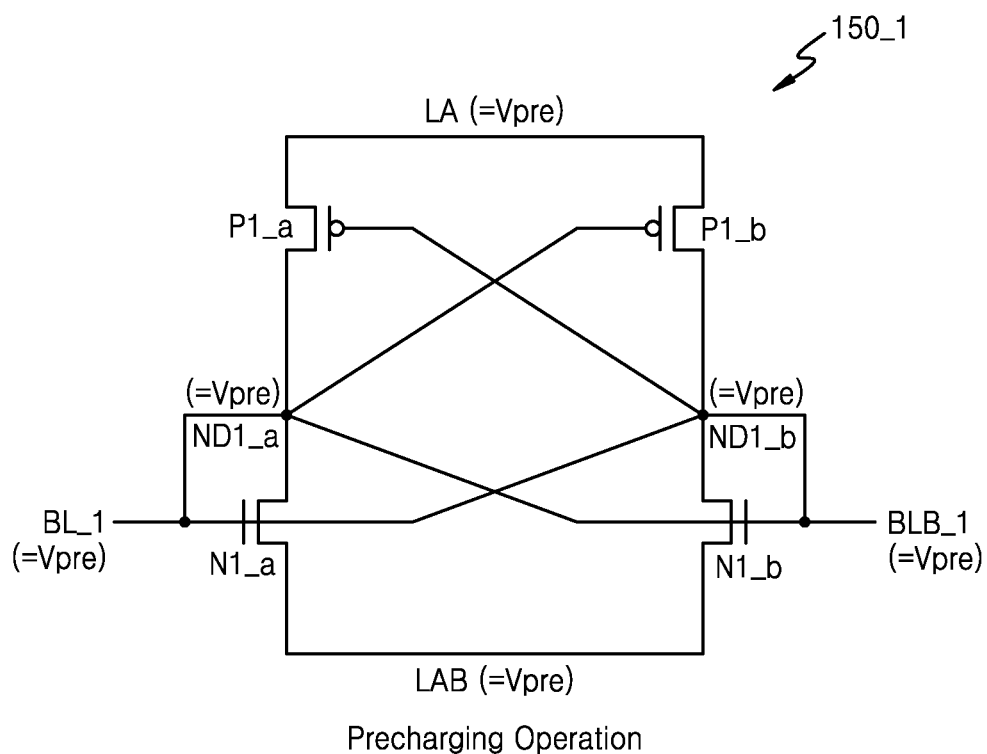
FIGS. 10A through 10D and 11 are diagrams for explaining operations of the bit line sense amplifier in FIG. 3 according to an exemplary embodiment of the inventive concept.

Referring to FIG. 10A, the bit line sense amplifier 150_1 may precharge the bit line BL_1 and the complementary bit line BLB_1 to the precharge voltage Vpre. Accordingly, the bit line BL_1 and the complementary bit line BLB_1 may be connected to one node and be precharged to the precharge voltage Vpre. At this time, the first and second control lines LA and LAB may be precharged to the precharge voltage Vpre.

Figure 10B:
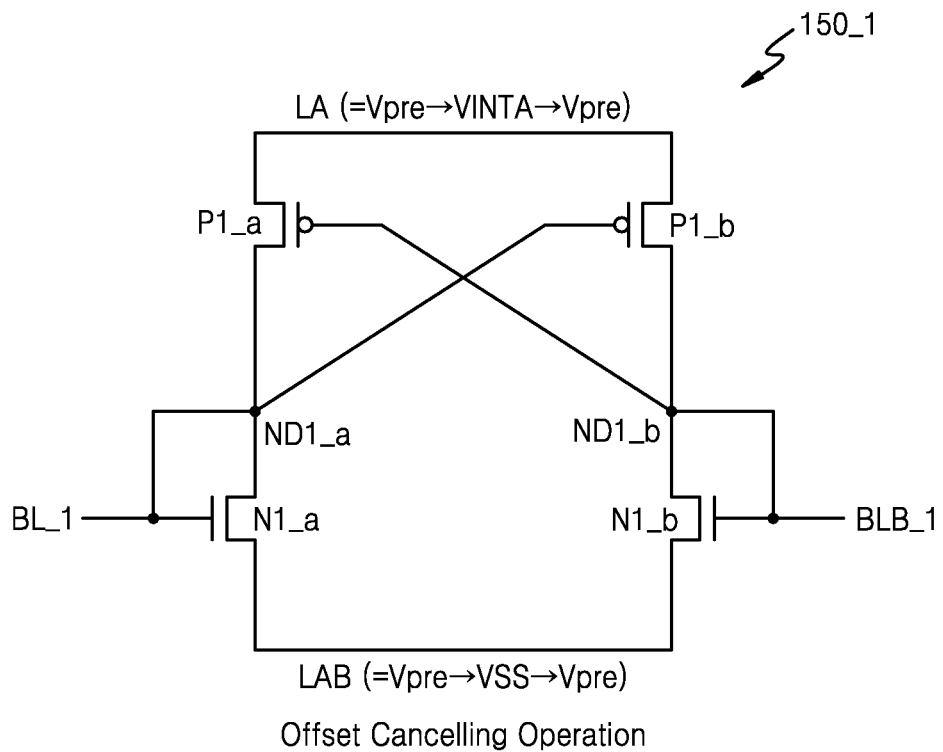

Referring to FIG. 10B, the bit line BL_1 may be connected to the first node ND1_a and a gate of the transistor P1_b, and the complementary bit line BLB_1 may be connected to the second node ND1_b and a gate of the transistor P1_a. At this time, the voltage of the first control line LA may shift from the precharge voltage Vpre to an internal power supply voltage VINTA, and the voltage of the second control line LAB may shift from the precharge voltage Vpre to a ground voltage VSS. Thereafter, the voltage of the first control line LA may shift from the internal power supply voltage VINTA to the precharge voltage Vpre, and the voltage of the second control line LAB may shift from the ground voltage VSS to the precharge voltage Vpre. An offset may be cancelled by the above operation.

Figure 10C:
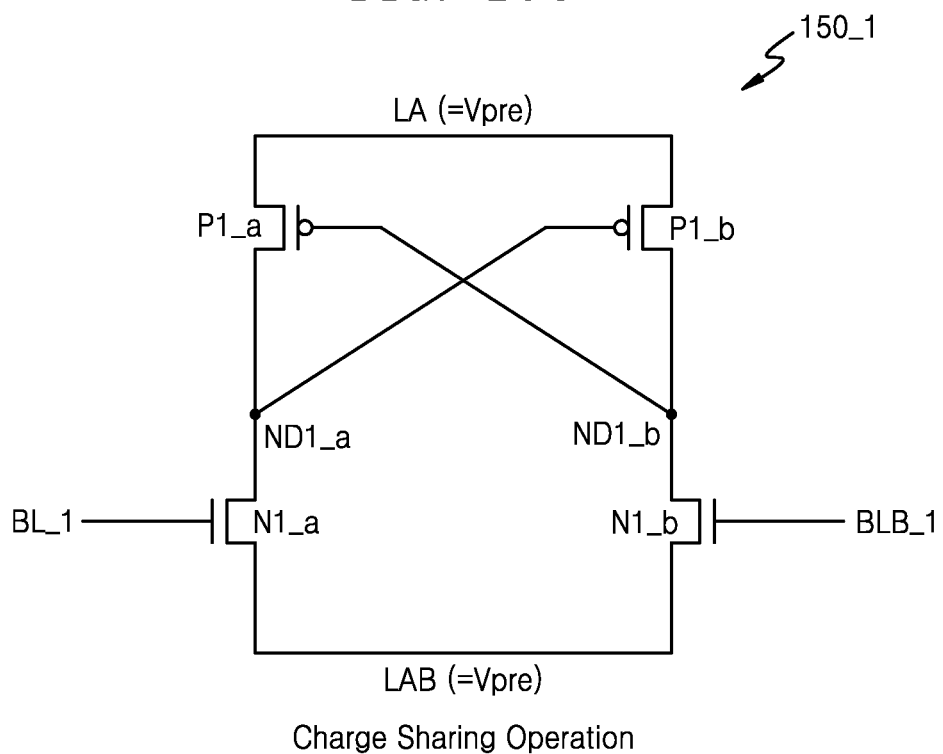

Referring to FIG. 10C, the first node ND1_a and the gate of the transistor P1_b may be connected to each other, and the second node ND1_b and the gate of the transistor P1_a may be connected to each other. At this time, the word line WL connected to the memory cell may be activated, and a charge sharing may occur between charge stored in the cell capacitor of the memory cell and charge stored in the bit line BL_1.

Figure 10D:
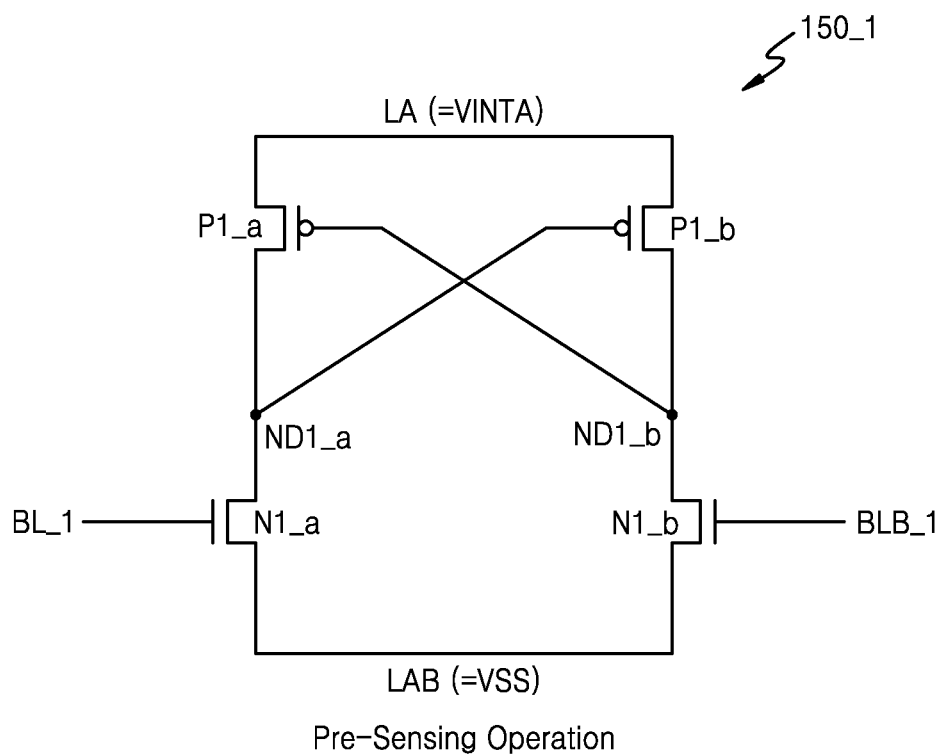

Referring to FIG. 10D, the bit line sense amplifier 150_1 may perform the sensing operation and a restoring operation. For example, when data of 1 is stored in the memory cell, the voltage of the bit line BL may increase to the internal supply voltage VINTA and the voltage of the complementary bit line BLB may decrease to the ground voltage VSS. Conversely, when data of 0 is stored in the memory cell MC, the voltage of the bit line BL may decrease to the ground voltage VSS and the voltage of the complementary bit line BLB may increase to the internal supply voltage VINTA. A voltage difference sensed and amplified by the bit line sense amplifier 150_1 may develop the voltages of the bit line BL_1 and the complementary bit line BLB_1 to the internal power supply voltage VINTA or the ground voltage VSS. After the sensing operation is performed, the restoring operation may be performed to store the data in the memory cell based on the developed voltages. In addition, the bit line BL_1 and the complementary bit line BLB_1, the voltages of which are developed to the voltage VINTA or the ground voltage VSS, may be connected to the data line and output the data to the data input/output circuit (160 in FIG. 1) via the data line.

Figure 11:
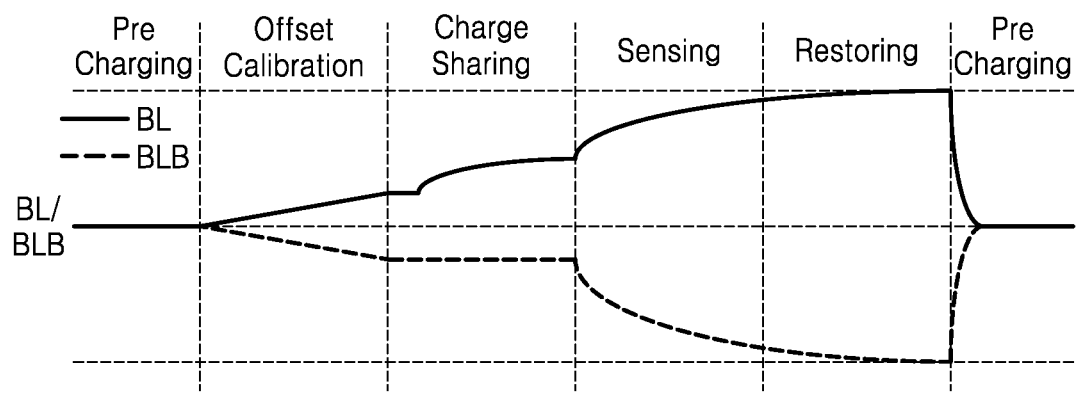

Referring to FIG. 11, as illustrated in FIGS. 10A through 10D, the bit line sense amplifier 150_1 may perform a precharge operation, an offset cancellation operation, the charge sharing operation, the sensing and restoring operation, and the precharge operation in sequence, and may sense and output data stored in the memory cell.

Figure 12A:
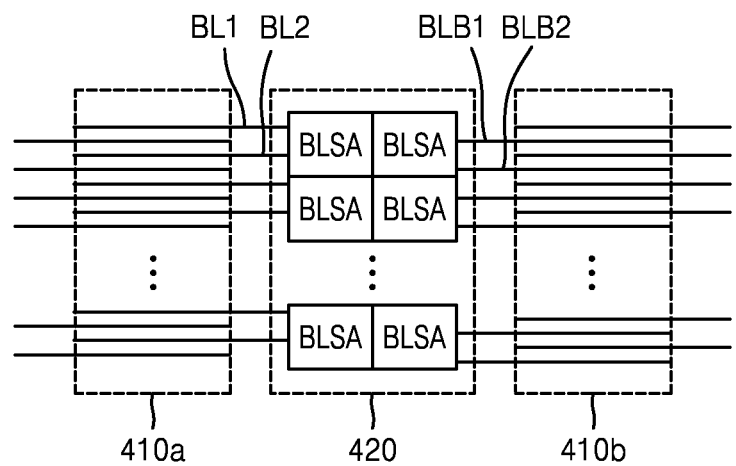
FIGS. 12A and 12B are diagrams illustrating bit line sense amplifiers to which layout structures of bit line sense amplifiers according to exemplary embodiments of the inventive concept are applied.
Figure 12B:
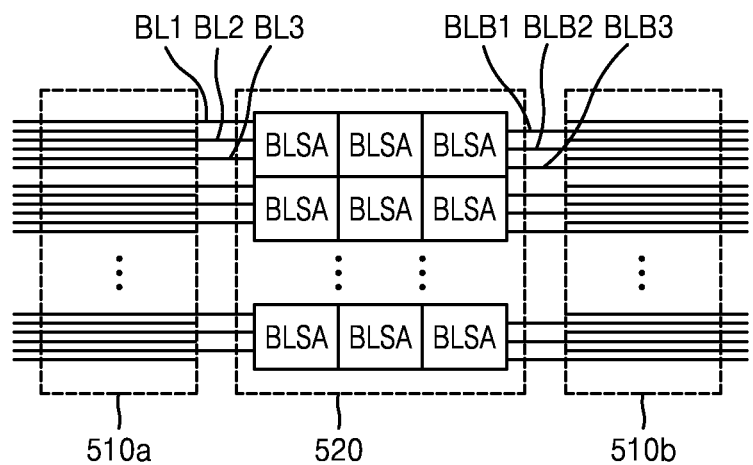

FIGS. 12A and 12B are diagrams illustrating bit line sense amplifier modules to which layout structures of bit line sense amplifiers according to exemplary embodiments of the inventive concept are applied.

Referring to FIG. 12A, a bit line sense amplifier module 420 may be connected between a first memory cell array block 410a and a second memory cell array block 410b. The bit line sense amplifier module 420 may be arranged such that two bit line sense amplifiers BLSA are adjacent to each other in the bit line direction. The layout structure according to exemplary embodiments of the inventive concept described with reference to FIGS. 6 through 9 may be applied to each bit line sense amplifier BLSA. Two bit line sense amplifiers BLSA may be connected to the first and second bit lines BL1 and BL2, and the first and second complementary bit lines BLB1 and BLB2, respectively. One of the two bit line sense amplifiers BLSA may sense voltage changes of a pair of the first bit line BL1 and the first complementary bit line BLB1, and the other may sense the voltage changes of the second bit lines BL2 and the second complementary bit line BLB2.

Referring to FIG. 12B, a bit line sense amplifier module 520 may be connected between a first memory cell array block 510a and a second memory cell array block 510b. The bit line sense amplifier module 520 may be arranged such that three bit line sense amplifiers BLSA are adjacent to one another in the bit line direction. The layout structure according to exemplary embodiments of the inventive concept described with reference to FIGS. 6 through 9 may be applied to each bit line sense amplifier BLSA. The three bit line sense amplifiers BLSA may be connected to the first through third bit lines BL1, BL2, and BL3, and the first through third complementary bit lines BLB1, BLB2, and BLB3. Each of the three bit line sense amplifiers BLSA may sense the voltage changes of each of the pair of first bit lines BL1 and BLB1, the pair of second bit lines BL2 and BLB2, and a pair of third bit lines BL3 and BLB3, respectively.

The bit line sense amplifier modules 420 and 520 in FIGS. 12A and 12B may be selectively applied as unit cell sizes are reduced due to miniaturization in design-rules caused by high integration of memory cell devices. According to an exemplary embodiment of the inventive concept, n bit line sense amplifiers BLSA (where n is an integer) may be arranged adjacent to one another, and the n bit line sense amplifiers BLSA may be connected to the first through $n^{th}$ bit lines BL1 through BLn and the first through $n^{th}$ complementary bit lines BLB1 through BLBn, respectively, and each of the n bit line sense amplifiers BLSA may sense the voltage changes of the pair of the first bit line BL1 and the first complementary bit line BLB_1 through a pair of the $n^{th}$ bit line BLn and the $n^{th}$ complementary bit line BLBn, respectively.

Figure 13:
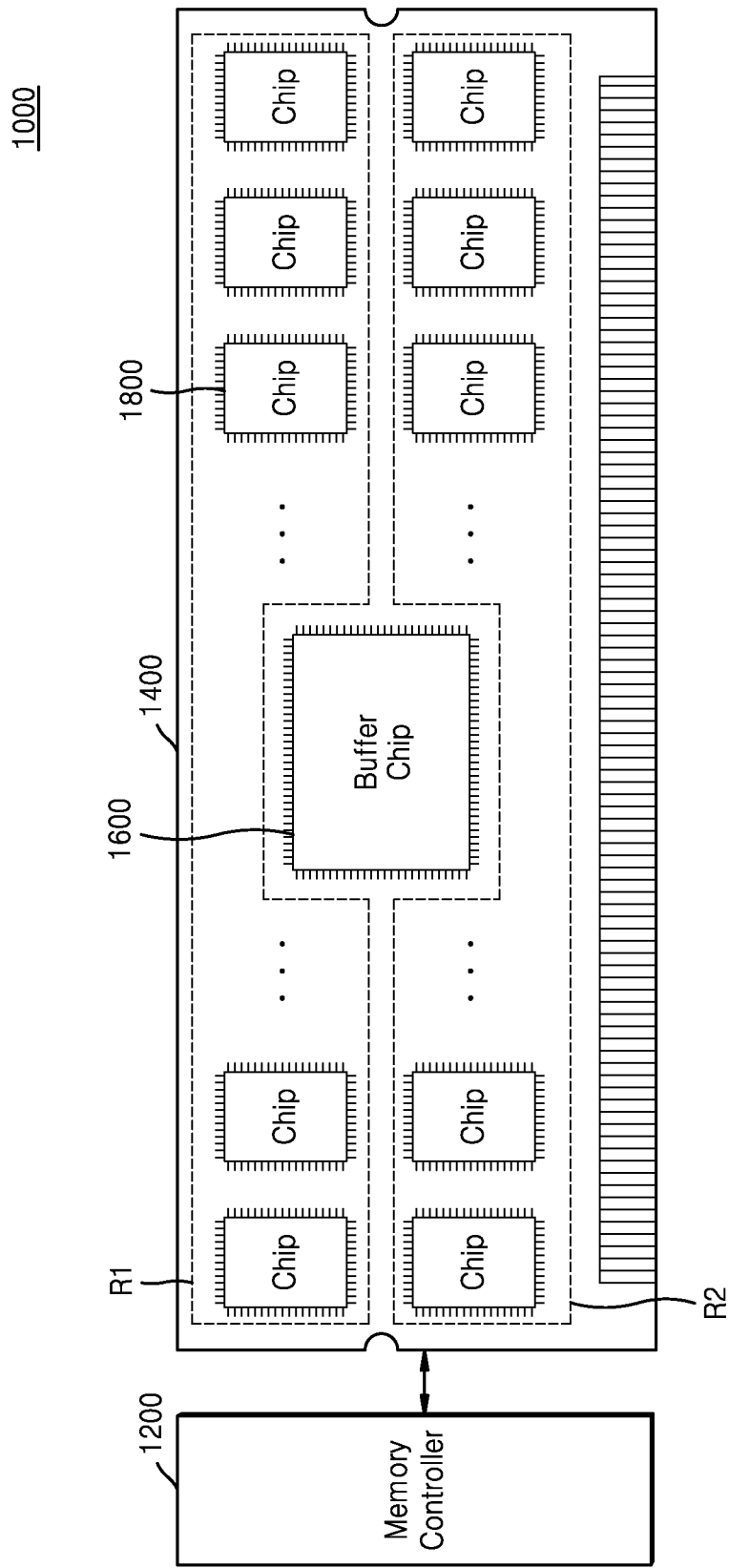
FIG. 13 is a block diagram illustrating a memory system according to an exemplary embodiment of the inventive concept.

FIG. 13 is a block diagram illustrating a memory system according to an exemplary embodiment of the inventive concept.

Referring to FIG. 13, a memory system 1000 may include a memory controller 1200 and a memory module 1400. The memory module 1400 may include one or more memory chips 1800 each of which includes the memory cell array, and a buffer chip 1600 to route signals transceived between the memory chips 1800 and the memory controller 1200 or to manage memory operations of the memory chips 1800. The memory chips 1800 of the memory module 1400 may be divided into a first rank R1 and a second rank R2. Each of the memory chips 1800 may include the bit line sense amplifier to which the layout structure of the bit line sense amplifier described with reference to FIGS. 6 through 9 is applied.

In FIG. 13, an example is illustrated in which some of functions of the memory controller 1200 are performed in the memory module 1400 of a load reduced dual in-line memory module (DIMM) (LRDIMM) type, but the inventive concept is not limited thereto. For example, when the memory module 1400 of a fully buffered DIMM (FBDIMM) type is applied, an advanced memory buffer (AMB) chip may be mounted on the memory module 1400 as a buffer chip. In addition, the memory module 1400 of another type may be applied, and the memory module 1400 may be implemented such that at least some of the functions of the memory controller 1200 described above may be performed in the memory module 1400.

Figure 14:
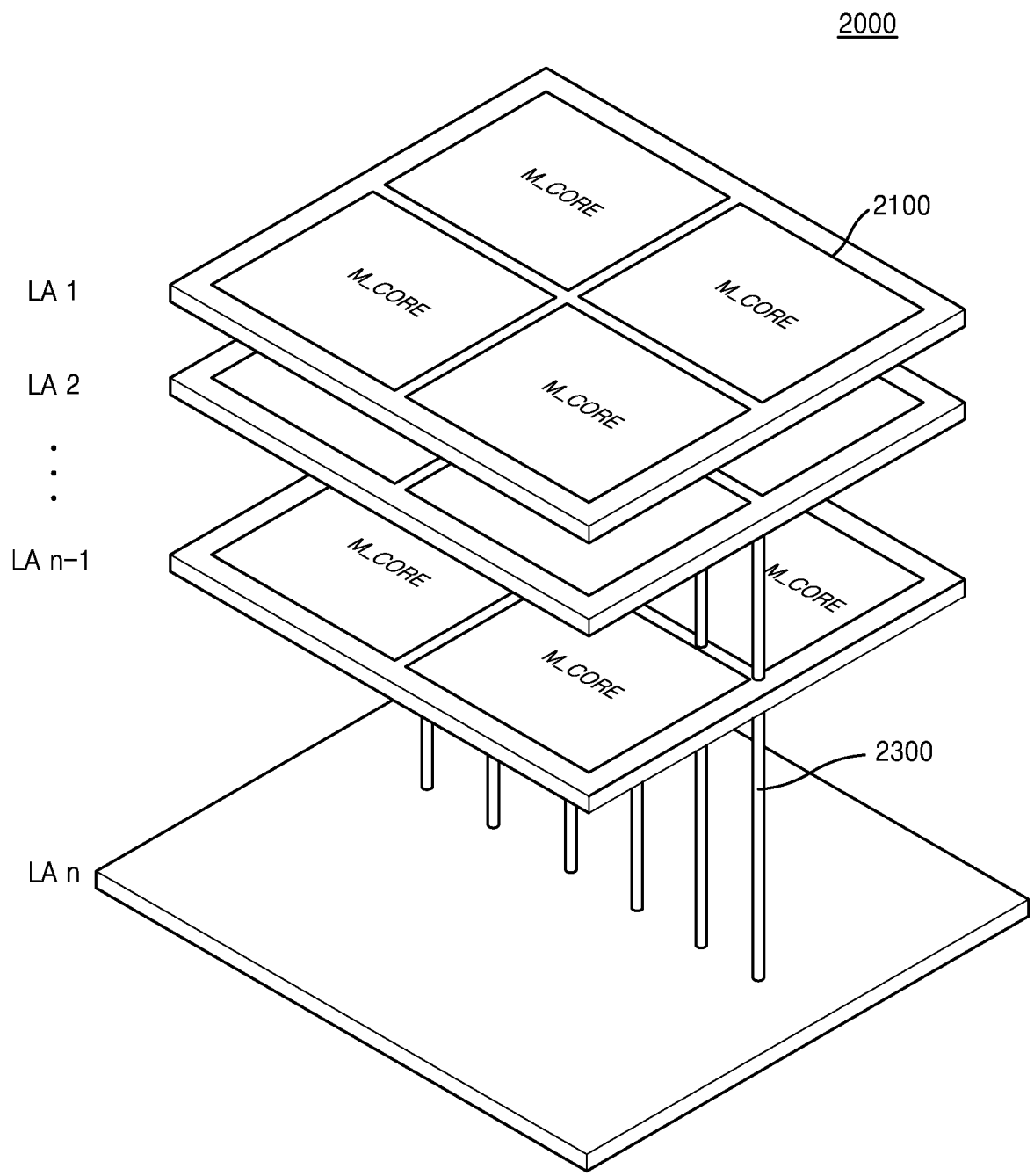
FIG. 14 is a block diagram illustrating a semiconductor package having a stacked structure including a plurality of layers according to an exemplary embodiment of the inventive concept.

FIG. 14 is a block diagram illustrating a semiconductor package having a stacked structure including a plurality of layers according to an exemplary embodiment of the inventive concept.

Referring to FIG. 14, a semiconductor package 2000 may include a first through $n^{th}$ layers LA1 through LAn (where n is an integer of 2 or more). Each of the first through $(n-1)^{th}$ layers LA1 through LAn−1 may be a memory layer (or a memory chip) including a plurality of memory cores (M_CORE) 2100. The memory core 2100 may include a memory cell array to store data, a row decoder, a column decoder, a sense amplifier, or the like. The $n^{th}$ layer LAn may be a buffer layer (or a buffer chip). In the semiconductor package 2000, the first through $n^{th}$ layers LA1 through LAn having the stacked structure may be interconnected via a through silicon via (TSV) 2300.

The $n^{th}$ buffer layer LAn may communicate with an external memory controller and the first through $(n-1)^{th}$ memory layers LA1 through LAn−1, and may route signals transceived between the first through $(n-1)^{th}$ memory layers LA1 through LAn−1 and the memory controller. Furthermore, the $n^{th}$ buffer layer LAn may queue signals received from the memory controller or from the first through $(n-1)^{th}$ memory layers LA1 through LAn−1. Each of the memory cores 2100 may include the bit line sense amplifier to which the layout structure of the bit line sense amplifier described with reference to FIGS. 6 through 9 is applied.

Figure 15:
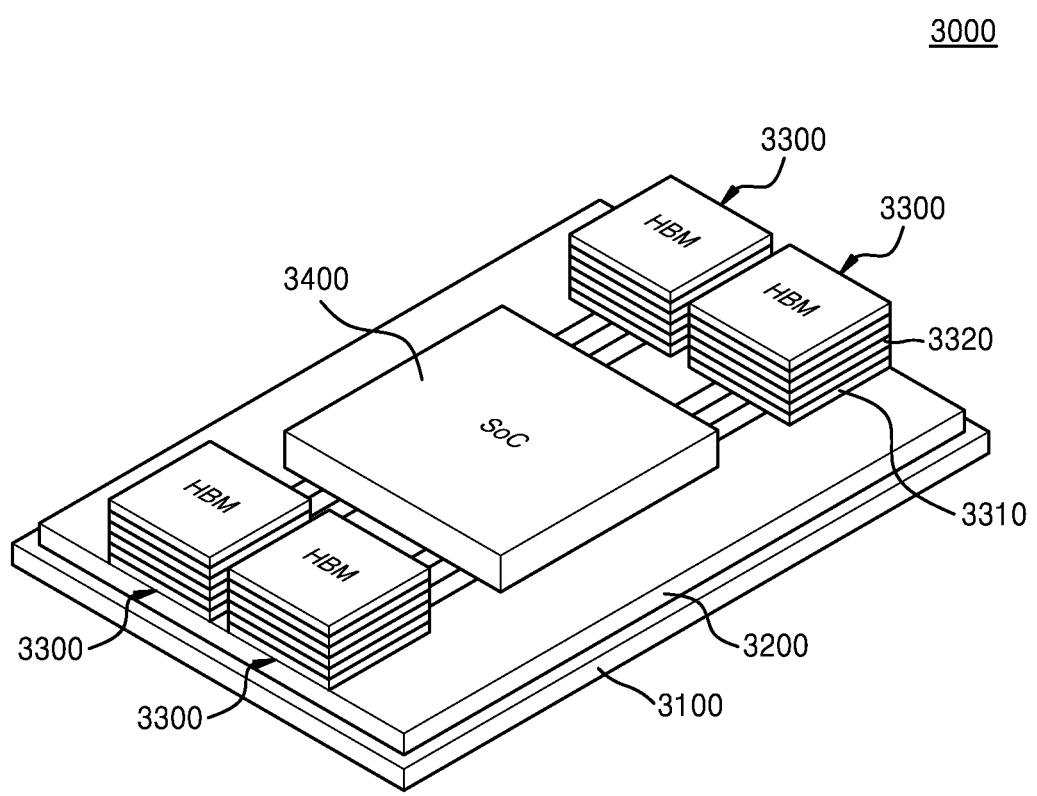
FIG. 15 is a diagram illustrating a semiconductor package including stacked semiconductor chips according to an exemplary embodiment of the inventive concept.

FIG. 15 is a diagram illustrating a semiconductor package including a stacked semiconductor chip according to an exemplary embodiment of the inventive concept.

Referring to FIG. 15, a semiconductor package 3000 may be a memory module including at least one stacked semiconductor chip 3300 mounted on a package substrate 3100 such as a printed circuit board (PCB), and a system-on-chip (SOC) 3400. Selectively, an interposer 3200 may be further provided on the package substrate 3100. The stacked semiconductor chip 3300 may be formed with a chip-on-chip (CoC) structure. The stacked semiconductor chip 3300 may include at least one memory chip 3320 stacked on a buffer chip 3310 such as a logic chip. The buffer chip 3310 and the at least one memory chip 3320 may be connected to each other via a through silicon via TSV. Each of the memory chips 3320 may include a bit line sense amplifier to which the layout structure of the bit line sense amplifier described with reference to FIGS. 6 through 9 is applied. The stacked semiconductor chip 3300 may be a high bandwidth memory (HBM) of, for example, 500 GB/sec to 1 TB/sec, or more.

While the inventive concept has been particularly shown and described with reference to exemplary embodiments thereof, it will be understood by one of ordinary skill in the art that various changes in form and details may be made thereto without departing from the spirit and scope of the inventive concept as set forth by the following claims.

What is claimed is:

1. A layout structure of a bit line sense amplifier in a semiconductor memory device, the layout structure of the bit line sense amplifier comprising:
   a first bit line sense amplifier which is connected to a first bit line and a first complementary bit line, and is controlled via a first control line and a second control line,
   wherein the first control line is connected to a first node of the first bit line sense amplifier and the second control line is connected to a second node of the first bit line sense amplifier,
   wherein the first bit line sense amplifier comprises at least one pair of transistors configured to share any one of a first active region corresponding to the first node and a second active region corresponding to the second node, and wherein first and second transistors of the at least one pair of transistors sharing the first active region have a shared source direct contact connected to any one of the first node and the second node.

2. The layout structure of the bit line sense amplifier of claim 1, wherein each gate of the at least one pair of transistors included in the first bit line sense amplifier is formed in a same direction as and in alignment with the first bit line or the first complementary bit line.

3. The layout structure of the bit line sense amplifier of claim 1, wherein the first control line is connected to an internal power supply of the semiconductor memory device and the second control line is connected to a ground terminal of the semiconductor memory device.

4. The layout structure of the bit line sense amplifier of claim 1, wherein the at least one pair of transistors included in the first bit line sense amplifier comprise a pair of p-channel transistors and a pair of n-channel transistors.

5. The layout structure of the bit line sense amplifier of claim 4, wherein the pair of p-channel transistors are configured to share the first active region.

6. The layout structure of the bit line sense amplifier of claim 5, wherein a source shared by the pair of p-channel transistors is formed in the first active region and the source is connected to the first control line.

7. The layout structure of the bit line sense amplifier of claim 4, wherein the pair of n-channel transistors are configured to share the second active region.

8. The layout structure of the bit line sense amplifier of claim 7, wherein a source shared by the pair of n-channel transistors is formed in the second active region and the source is connected to the second control line.

9. The layout structure of the bit line sense amplifier of claim 1, further comprising a second bit line sense amplifier which is connected to a second bit line and a second complementary bit line, and is controlled via the first control line and the second control line,
wherein the first control line is connected to a third node of the second bit line sense amplifier and the second control line is connected to a fourth node of the second bit line, and
the second bit line sense amplifier comprises at least one pair of transistors sharing any one of a third active region corresponding to the third node and a fourth active region corresponding to the fourth node.

10. The layout structure of the bit line sense amplifier of claim 9, wherein, when the at least one pair of transistors included in the first bit line sense amplifier does not share the second active region, at least one transistor of the at least one pair of transistors included in the first bit line sense amplifier is configured to share the second active region with at least one transistor of the at least one pair of transistors included in the second bit line sense amplifier.

11. The layout structure of the bit line sense amplifier of claim 9, wherein, when the at least one pair of transistors included in the first bit line sense amplifier does not share the first active region, at least one transistor of the at least one pair of transistors included in the first bit line sense amplifier is configured to share the first active region with at least one transistor of the at least one pair of transistors included in the second bit line sense amplifier.

12. A layout structure of a bit line sense amplifier in a semiconductor memory device, the layout structure of the bit line sense amplifier comprising:
the bit line sense amplifier which is connected to a bit line and a complementary bit line, and is controlled via a first control line and a second control line,
wherein the bit line sense amplifier comprises a first transistor and a second transistor configured to share a first active region, the first active region corresponding to a first node connected to the first control line, and
wherein the first transistor and the second transistor share a source direct contact connected to the first node.

13. The layout structure of the bit line sense amplifier of claim 12, wherein a channel of the first transistor and a channel of the second transistor are formed in a same direction as and in alignment with the bit line and the complementary bit line, respectively.

14. The layout structure of the bit line sense amplifier of claim 12, wherein, when the first control line is a line connected to an internal power supply of the semiconductor memory device, a first terminal shared by the first transistor and the second transistor is formed in the first active region, and a control terminal of the first transistor is connected to the complementary bit line and a control terminal of the second transistor is connected to the bit line.

15. The layout structure of the bit line sense amplifier of claim 14, wherein the first terminal and the first control line are connected to each other.

16. The layout structure of the bit line sense amplifier of claim 14, wherein an extended bit line is further formed to connect a second terminal of the first transistor to the bit line, and an extended complementary bit line is further formed to connect a second terminal of the second transistor to the complementary bit line.

17. The layout structure of the bit line sense amplifier of claim 12, wherein the bit line sense amplifier further comprises a third transistor and a fourth transistor configured to share a second active region corresponding to a second node connected to the second control line.

18. A layout structure of a bit line sense amplifier configured to perform a sensing operation and an amplifying operation for a memory operation of memory cells connected between a plurality of word lines and a plurality of bit lines, the layout structure of the bit line sense amplifier comprising:
a first bit line sense amplifier which is connected to a first bit line and a first complementary bit line, controlled via a first control line and a second control line, the first bit line sense amplifier comprises a first transistor, a second transistor, and a first active region corresponding to a first node connected to the first control line,
wherein the first transistor connected to the first complementary bit line via a gate is configured to share the first active region with the second transistor connected to the first bit line via a gate,
wherein the first transistor and the second transistor share source direct contacts connected to the first node, and
wherein the second transistor is arranged adjacent to the first transistor in a direction of the plurality of word lines.

19. The layout structure of the bit line sense amplifier of claim 18, wherein the first bit line sense amplifier further comprises a third transistor, a fourth transistor, and a second active region corresponding to a second node connected to the second control line,
the third transistor connected to the first complementary bit line via a gate is configured to share the second active region with the fourth transistor connected to the first bit line via a gate, and
the fourth transistor is arranged adjacent to the third transistor in the direction of the plurality of word lines.

20. The layout structure of the bit line sense amplifier of claim 18, further comprising:

a second bit line sense amplifier which is connected to a second bit line and a second complementary bit line, and is controlled via the first control line and the second control line, wherein the second bit line sense amplifier is arranged adjacent to the first bit line sense amplifier in a direction of the first bit line or the second bit line.

* * * * *